US012769357B2

(12) United States Patent
Hesson

(10) Patent No.: US 12,769,357 B2
(45) Date of Patent: Oct. 20, 2026

(54) GLOBAL AND LOCAL CLOCK DISTRIBUTION NETWORKS FOR MULTIPROCESSOR SYSTEMS

(71) Applicant: HyperX Holdings LLC, Austin, TX (US)

(72) Inventor: James Henry Hesson, Austin, TX (US)

(73) Assignee: HyperX Holdings LLC, Austin, TX (US)

( * ) Notice: Subject to any disclaimer, the term of this patent is extended or adjusted under 35 U.S.C. 154(b) by 86 days.

(21) Appl. No.: 18/897,452

(22) Filed: Sep. 26, 2024

(65) Prior Publication Data

US 2025/0110527 A1 Apr. 3, 2025

Related U.S. Application Data

(60) Provisional application No. 63/586,318, filed on Sep. 28, 2023.

(51) Int. Cl.

| | |
|---|---|
| ***G06F 1/10*** | (2006.01) |
| ***G06F 1/12*** | (2006.01) |
| ***H03K 19/0185*** | (2006.01) |

(52) U.S. Cl.

CPC .................. *G06F 1/10* (2013.01); *G06F 1/12* (2013.01); *H03K 19/01855* (2013.01)

(58) Field of Classification Search

CPC ........ G06F 1/10; G06F 1/12; H03K 19/01855

See application file for complete search history.

(56) References Cited

U.S. PATENT DOCUMENTS

| | | | |
|---|---|---|---|
| 5,668,484 A | 9/1997 | Nomura | |
| 5,842,005 A | 11/1998 | Walsh et al. | |
| 8,963,599 B2 * | 2/2015 | Dobbs ................ | G06F 11/1604 327/258 |
| 10,949,266 B2 | 3/2021 | Lacey et al. | |

(Continued)

FOREIGN PATENT DOCUMENTS

WO 2023/284116 A1 1/2023

OTHER PUBLICATIONS

International Search Report and Written Opinion for International Application No. PCT/US2024/048594; mailed Dec. 23, 2024; 13 pgs.

*Primary Examiner* — Brian T Misiura

(74) *Attorney, Agent, or Firm* — Kowert, Hood, Munyon, Rankin & Goetzel, P.C.; Jeffrey C. Hood; Luke Langsjoen

(57) ABSTRACT

A dual-rail buffer circuit is utilized to construct a modular global clock distribution network. The dual-rail buffer circuit includes first and second input ports, and first and second output ports coupled via respective first and second channels to the first and second input ports. The dual-rail buffer circuit includes two inverters on the first channel and two inverters on the second channel. The dual-rail buffer circuit also includes two fractional feed-forward equalizers that cross-connect between the two channels. A global clock distribution network includes a plurality of standardized units and T connections configured in a tree structure, where each standardized unit includes the dual-rail buffer circuit coupled to a transmission line. The modular global clock distribution network provides synchronized timing information to a plurality of circuit modules. The length of the standardized units is determined from a pitch length of the circuit modules.

20 Claims, 23 Drawing Sheets

(56) References Cited

U.S. PATENT DOCUMENTS

| | | | |
|---|---|---|---|
| 11,093,674 B2 | 8/2021 | Asaad et al. | |
| 11,106,510 B2 | 8/2021 | Wilkinson et al. | |
| 2010/0271099 A1 | 10/2010 | Le et al. | |
| 2013/0135017 A1* | 5/2013 | Jones | H03K 3/356173<br>327/155 |

* cited by examiner

GLOBAL AND LOCAL CLOCK DISTRIBUTION NETWORKS FOR MULTIPROCESSOR SYSTEMS

PRIORITY CLAIM

The present application claims benefit of priority of provisional application Ser. No. 63/586,318 titled "Global and Local Clock Distribution Networks for Multiprocessor Systems" and filed on Sep. 28, 2023, which is hereby incorporated by reference in its entirety as though fully and completely set forth herein.

TECHNICAL FIELD

This application relates to electronic systems and, more particularly, to clock signal distribution networks within digital electronic systems, and especially to clock distribution within integrated circuit (IC) chips that contain many processing units.

DESCRIPTION OF THE RELATED ART

For large, expensive computer systems, their economics dictates that they be kept busy all the time. Performance was traditionally measured as computations per second. For small, inexpensive computers, continuous high speed operation is not required, and is even a hindrance for battery operated devices. Increasingly, computer and digital signal processor (DSP) performance is measured in computations per second per watt or computations per joule of energy used.

While there are entertainment applications that require high performance operation for hours at a time, most uses of small computers require bursts of high performance for less than a minute. In fact there are many time intervals when a small embedded computer or digital signal processor (DSP) may operate just fine at reduced speeds. Since the circuit technologies for microcomputers consume electrical power in proportion to compute speed; opportunities to run at reduced speed are opportunities to reduce power consumption and conserve battery charge. The opportunities may be greatest for personal electronic devices (PEDs), where human interests and attention place highly variable demands on the micro-computers and DSPs embedded therein. Accordingly, improvements in the field of computational clock control are desired.

SUMMARY OF THE INVENTION

Embodiments are presented herein for a dual-rail buffer circuit. In some embodiments, the dual-rail buffer circuit is utilized to construct a modular global clock distribution network.

In some embodiments, the dual-rail buffer circuit comprises a first input port (AH) configured to receive a first input signal, a second input port (AL) configured to receive a second input signal, a first output port (ZH) coupled via a first channel to the first input and configured to output a first output signal, a second output port (ZL) coupled via a second channel to the second input and configured to output a second output signal, a zeroth inverter (X0) and a second inverter (X2) comprised within the first channel between the first input and the first output, and a first inverter (X1) and a third inverter (X3) comprised within the second channel between the second input and the second output.

In some embodiments, the dual-rail buffer circuit further comprises a sixth inverter (X6), where the sixth inverter is connected to the first channel after the zeroth and second inverters, and where the sixth inverter is connected to the second channel before the first and third inverters; and a seventh inverter (X7), where the seventh inverter is connected to the first channel before the zeroth and second inverters, and where the seventh inverter is connected to the second channel after the first and third inverters.

In some embodiments, a global clock distribution network includes a plurality of standardized units, where each standardized unit includes the dual-rail buffer circuit coupled to a transmission line; and a plurality of T connections.

In some embodiments, the plurality of standardized units and the plurality of T connections are configured in a tree structure including a plurality of stages.

In some embodiments, the modular global clock distribution network is configured to provide synchronized timing information to each of a plurality of circuit modules.

In some embodiments, the length of the standardized units is determined based at least in part on a pitch length of the circuit modules.

BRIEF DESCRIPTION OF THE DRAWINGS

A better understanding of the present invention can be obtained when the following detailed description of the preferred embodiment is considered in conjunction with the following drawings, in which.

Figure 1:
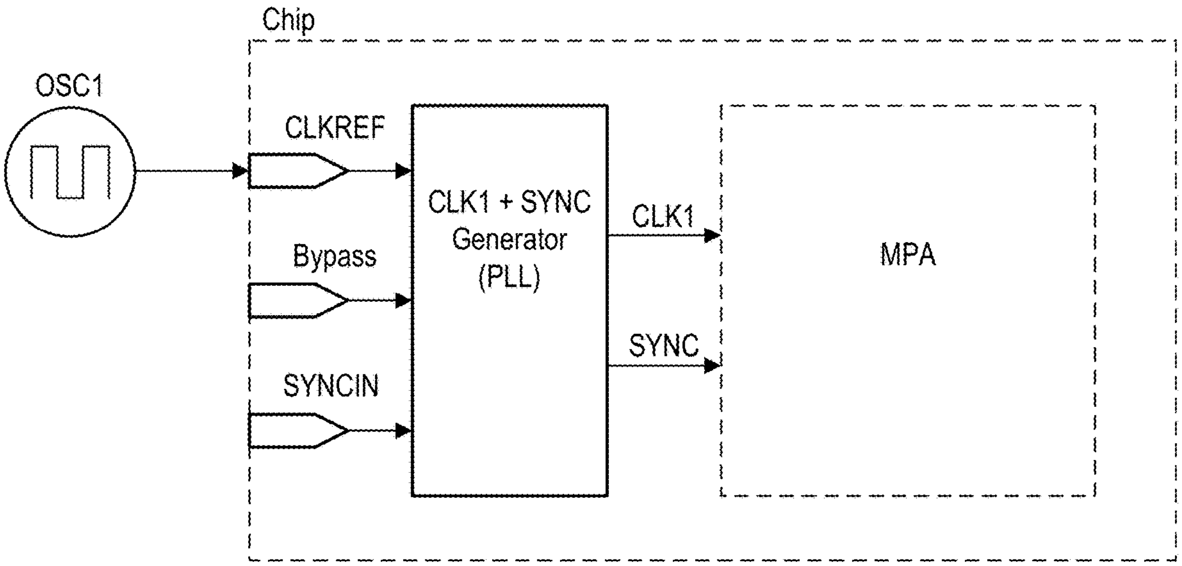
FIG. 1 is a block diagram illustrating a computer chip including a multiprocessor array (MPA) coupled to a clock generator.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Flowchart diagrams are provided to illustrate exemplary embodiments, and are not intended to limit the disclosure to the particular steps illustrated. In various embodiments, some of the method elements shown may be performed concurrently, performed in a different order than shown, or omitted. Additional method elements may also be performed as desired.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) interpretation for that unit/circuit/component. More generally, the recitation of any element is expressly intended not to invoke 35 U.S.C. § 112(f) interpretation for that element unless the language "means for" or "step for" is specifically recited.

DETAILED DESCRIPTION OF EMBODIMENTS

Terms

Hardware Configuration Program—a program consisting of source text that can be compiled into a binary image that can be used to program or configure hardware, such as an integrated circuit, for example.

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer system for execution. The term "memory medium" may include two or more memory mediums which may reside in different locations, e.g., in different computer systems that are connected over a network. The memory medium may store program instructions (e.g., embodied as computer programs) that may be executed by one or more processors.

Processing Element (or Processor)—refers to various elements or combinations of elements that are capable of performing a function in a device, e.g., in a user equipment device or in a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Computer System (or Computer)—any of various types of computing or processing systems, including a personal computer system (PC), mainframe computer system, workstation, network appliance, internet appliance, personal digital assistant (PDA), grid computing system, or other device or combinations of devices. In general, the term "computer system" can be broadly defined to encompass any device (or combination of devices) having at least one processor that executes instructions from a memory medium.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Although the above embodiments have been described in connection with the preferred embodiment, it is not intended to be limited to the specific form set forth herein, but on the contrary, it is intended to cover such alternatives, modifications, and equivalents, as can be reasonably included within the spirit and scope of the embodiments of the invention as defined by the appended claims.

Single Processor Systems

In a computer with only one processing unit, the processor can adjust its own speed by writing to special circuits that generate the system clock signal. This may be used to match the system clock frequency to the average workload. However, reduced system clock frequency (or rate) also slows the resident kernel of the operating system software and its response time. Depending on implementation, users may notice pauses when the machine needs to up-shift to a faster clock rate for more computations-per-second performance.

Single-processor computers and their control software often also have user adjustable time-outs. The more power-down modes in the hardware, the more finely the system can adapt its power use to actual demand for computation. For example, a processor may switch to a reduced speed and reduced supply voltage state after an initial timeout, into a clock-stopped state after a longer timeout; and into a low voltage sleep state after a yet longer timeout. These low voltage states maintain data in volatile memory, which is advantageous to quick re-activation. If a processor's power is completely cut off, the data in its volatile memory is lost; and upon re-activation of the processor, data will have to be reloaded from non-volatile memory.

Multi-Processor Systems

Large multiprocessor systems have pioneered many techniques to improve computations per second but have been less aggressive with power management. With the advent of PEDs using inexpensive IC chips containing multiple processing units, the demand for energy efficiency has increased a great deal.

Advantages of multiprocessing include much higher computational throughput for algorithms converted for parallel execution, and increased reliability and security due to separation of processes onto different processors and memories. In a multiprocessor system it is much less likely that a supervisory process executing on its own processor will be delayed by an application process executing on other processors.

Within applications, some processors may be slowed and others accelerated depending on external events. For example, the performance of a video processor for display of video data may depend on type of data and user activity. (In this example a video processor may be a single unit specialized for video, or it may be a group of processing elements programmed to processes video in a parallel way). If a user is editing video, there may be frequent pauses in the display of motion. While paused, the video processor may be lowered to idle speed, ready to respond but dissipating less power than at full speed. Meanwhile, the user interface may be handled by a different processor optimized for user interaction.

Another way to conserve power in a multi-processor system is to arrange for multiple processors to run on a variety of clock frequencies—fast clocks for critical paths in a computation and slower clocks for other parts. Since the opportunities to save power are highly dependent on application software, it is desirable for the clock distribution hardware to be configurable, preferably configurable rapidly from application software.

Exemplary Multiprocessor IC

FIG. 1 illustrates an embodiment of a multiprocessor IC for the purpose of illuminating clock distribution network design issues/problems addressed by embodiments herein. As illustrated in FIG. 1, an exemplary hx3100A multiprocessor IC includes an MPA, which receives as inputs a clock signal CLK1 and a synchronizing signal SYNC. The CLK1 and SYNC signals are generated by a CLK1+SYNC Generator, and may be provided by a phase-locked loop (PLL). The CLK1+SYNC Generator receives as inputs a clock reference signal CLKREF, a clock bypass signal Bypass, and a system synchronization signal SYNCIN. Other inputs and other components present on the hx3100A multiprocessor IC are not illustrated. Clock reference signal CLKREF is a system reference clock that may be used to synchronize operations between different chips, and is illustrated in FIG. 1 as being generated by an oscillator OSC1. Components in this and other figures are not shown to scale.

The MPA of the hx3100A multiprocessor IC has a 10×10 array of PE that are interspersed in an 11×11 mesh of nodes of an interconnection network (IN). Each IN node contains shared data memory (DM) to support the neighboring four PE; and each PE may access shared DM in the four neighboring nodes surrounding it. Each PE has private instruction memory (IM).

The chip is divided into four quadrants for internal dc power supply distribution; the positive side of the power distribution network is divided into four "voltage islands" that may be separately coupled to external power supplies. The negative side of the distribution network is coupled to system zero reference "ground."

The circuits crossing the boundaries between quadrants may be designed simply to operate with adjacent voltage islands at the same voltage and to self-protect when one voltage island is switched off. The circuits crossing the boundary may be made further capable of operation with adjacent voltage islands at different non-zero voltages with the addition of level-shifting circuits. Level shifting circuits are well known in the industry, and easily added, but they may introduce additional power dissipation and signal delay.

The clock distribution network for the hx3100A chip supports moderately large (16×) frequency differences between the processors and their supporting memory (SM) elements and interconnection network (IN) while maintaining an overall synchronous array. All processor memory accesses and data transfers in the core array occur in step with a global clock signal.

The hx3100 has a clock tree with distributed regenerators architecture. It distributes a clock signal to every part of the chip with relatively low power dissipation while limiting clock skew between PE and local nodes. An H tree was also considered, but it would have had more regenerators than the tree chosen, and thus would dissipate more power. The disadvantage of this tree compared the H tree is that the central area has a clock signal that is skewed (phase advanced) in steps with respect to the perimeter of the chip. However, the multiprocessor architecture for which it is designed has mostly short links and connections to nearest neighbors, and thus good tolerance of the skew between steps.

Multi-Processor Arrays

Increasingly, digital electronic systems such as computers and digital signal processors (DSP) utilize one or more multi-processor arrays (MPAs). An MPA may be loosely defined as a plurality of processing elements (PEs), supporting memory (SM), and a high bandwidth interconnection network (IN). As used herein, the term "processing element" refers to a processor or CPU (central processing unit), microprocessor, or a processor core. The word "array" in MPA is used in its broadest sense to mean a plurality of computational units (each of which may contain processing and/or memory resources) interconnected by a network with connections available in one, two, three, or more dimensions, including circular dimensions (loops or rings). Note that a higher dimensioned MPA can be mapped onto fabrication media with fewer dimensions, provided that the media supports the increased wiring density. For example, an MPA with the shape of a four dimensional (4D) hypercube can be mapped onto a 3D stack of silicon integrated circuit (IC) chips, or onto a single 2D chip, or even a 1D line of computational units. Also, low dimensional MPAs can be mapped to higher dimensional media. For example, a 1D line of computation units can be laid out in a serpentine shape onto the 2D plane of an IC chip, or coiled into a 3D stack of chips. An MPA may contain multiple types of computational units and interspersed arrangements of processors and memory. Also included in the broad sense of an MPA is a hierarchy or nested arrangement of MPAs, especially an MPA composed of interconnected IC chips where the IC chips contain one or more MPAs which may also have deeper hierarchal structure.

There may be one or more interconnection networks (INs) in an MPA or between MPAs of differing type. The purpose of interconnection networks in MPAs is to move data, instructions, status, configuration, or control information between and among PE, SM, and I/O. The primary interconnection network (PIN) is designed for high bandwidth data movement, with good but not extremely low latency (the time delay for the delivery of data between source and destination). The data moved by the PIN may encapsulate other types of information provided there is hardware or software at the data destination that is able to translate the data to the other types of information. An MPA may have other, secondary INs; these may exhibit lower or higher latency but generally will have much lower bandwidth.

An IN is composed of links and nodes. A link is typically composed of a set of parallel "wires" implemented as electrically conductive paths (tracks or traces) on a circuit board or an IC. A node contains ports for coupling to the links, which contain the transmitter and receiver circuits to send and receive signals on the links. A node may have other ports for communications with PE or SM. A node has a Router which contains data paths and switches for connecting ports to each other, plus a router control mechanism for selectively connecting ports according to one or more protocols.

To achieve high bandwidth, each link of the PIN may include many parallel wires. If the distance between nodes is small, links are short and standard a CMOS binary signaling scheme may be used, wherein a steady signal voltage near the high side of the power supply is a signal state (H) that represents a logical 1 and a steady signal voltage near the low (or ground) side of the power supply is the other binary state (L) and represents a logical 0. In this signaling scheme, one wire encodes one bit of information. If the length of a link is long, such as between IC chips or between circuit boards, different signaling schemes may be better suited to maintain high speed and reject noise.

The parallel wires in a link may carry data or clock signals. The purpose of a clock signal is to mark points in time where transmit circuits may change data signals and where receive circuits may sample data signals. In a properly designed circuit, the sampling time occurs after a changed data signal settles to a steady-state value. A transmitter may use a clock signal to trigger when it drives a line to signal state H or L; a receiver circuit may use a clock signal to latch the data signals into a register. A common convention is that a receiver latches data on the rising (0 to 1) transition of its clock signal, while a transmitter updates its outputs at the falling (1 to 0) transition of its clock signal. These signal state transitions take a finite amount of time to complete but if the rise and fall intervals are short compared to the interval used to represent a bit, the transitions may also be referred to as "edges".

If a clock signal is shared amongst multiple transmitters and receivers, then they are said to be synchronized and the data transfer is generally referred to as "synchronous" data transfer. "Asynchronous" data transfer is simply any scheme where data signals may be transmitted and received without the use of a common clock signal. An asynchronous receiver is more flexible for sampling data signals than a synchronous receiver. In particular, it may sample and latch data at timepoints that are quite different from its local clock signal. Some asynchronous receivers work by oversampling the input to look for data signal transitions. Simpler asynchronous receivers accept a clock (or strobe) input signal that originates with the transmitter and is carried along with data; the strobe input latches the data at the front end of the receiver and it is then buffered and retimed for synchronous outputs.

Figure 2:
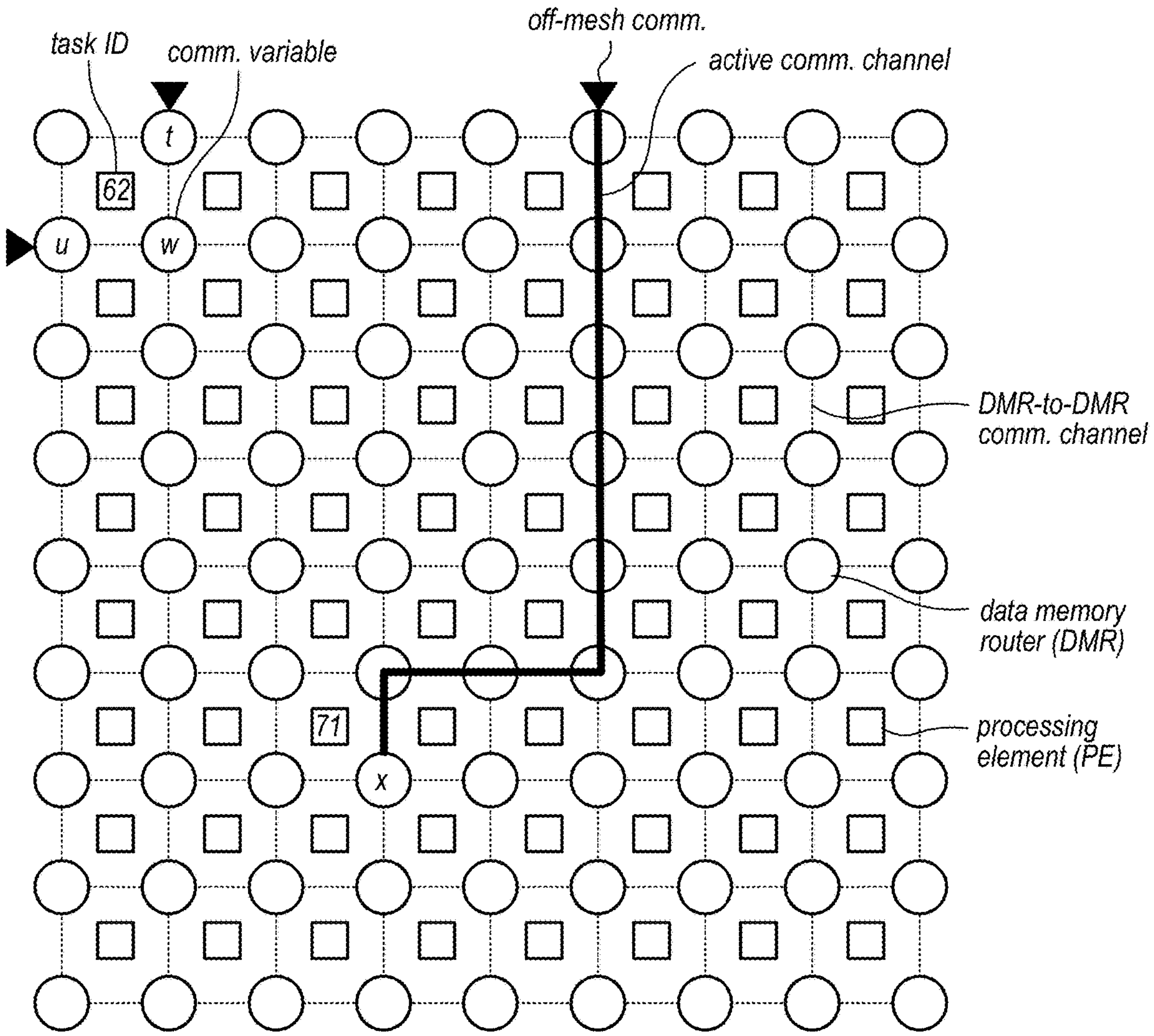
FIG. 2 illustrates an embodiment of an exemplary multiprocessor array (MPA) system, according to some embodiments.

FIG. 2 illustrates a view of a network of processing elements (PE's) and Data Memory Routers (DMRs) of one exemplary embodiment of a HyperX™ system. The PE's are shown as rectangular blocks and the DMRs are shown as circles. The routing channels between DMRs are shown as dotted lines. In the illustrated embodiment, solid triangles show off-mesh communication (which may also be referred to as chip inputs and/or outputs) and solid lines show active data communication between DMRs. A computational task is shown by its numerical identifier and is placed on the PE that is executing it. A data variable being used for communication is shown by its name and is placed on the DMR that contains it. In the illustrated example, the top left PE has been assigned a task with task ID 62, and may communicate with other PEs or memory via the respective DMRs adjacent to the PE, designated by communication path variables t, w, and u. As also shown, in this embodiment, an active communication channel connects a PE designated 71 (e.g., another task ID) to an off-mesh communication path or port. In some embodiments, PEs may communicate with each other using both shared variables (e.g., using neighboring DMRs) and message passing along the IN. In various embodiments, software modules developed according to the techniques disclosed herein may be deployed on portions of the illustrated network.

In some embodiments, a multiprocessor system is implemented on a chip. The chip may include multiple I/O routers for communication with off-chip devices, as well as an interior multiprocessor fabric, similar to the exemplary system of FIG. 2. A HyperX™ processor architecture may include inherent multi-dimensionality, but may be implemented physically in a planar realization as shown. The processor architecture may have high energy-efficient characteristics and may also be fundamentally scalable (to large arrays) and reliable—representing both low-power and dependable notions. Aspects that enable the processor architecture to achieve this performance include the streamlined processors, memory-network, and flexible IO. In some embodiments, the processing elements (PEs) may be full-fledged DSP/GPPs and based on a memory to memory (cacheless) architecture sustained by a variable width instruction word instruction set architecture that may dynamically expand the execution pipeline to maintain throughput while simultaneously maximizing use of hardware resources.

In some embodiments, the multiprocessor system includes MPA inputs/outputs which may be used to communicate with general-purpose off-mesh memory (e.g., one or more DRAMs in one embodiment) and/or other peripherals.

Software is the ensemble of instructions (also called program code) that is required to operate a computer or other stored-program device. Software can be categorized according to its use. Software that operates a computer for an end user for a specific use (such as word processing, web surfing, video or cell phone signal processing, etc.) may be termed application software. Application software includes the source program and scripts written by human programmers, a variety of intermediate compiled forms, and the final form called run time software may be executed by the target device (PE, microprocessor, or CPU). Run time software may also be executed by an emulator which is a device designed to provide more visibility into the internal states of the target device than the actual target device for the purposes of debugging (error elimination).

For multiprocessors systems there is an important extra step compared to a single processor system, which is the allocation of particular processing tasks or modules to particular physical hardware resources—such as PEs and the communication resources between and among PEs and system I/O ports. Note that resource allocation may include allocation of data variables onto memory resources, because allocation of shared and localized memory may have an impact on allocation of the PE and communication resources, and vice versa. This extra step is referred to as "resource allocation". The resource allocation part of the flow may utilize a placement and routing tool, which may be used to assign tasks to particular PE in the array, and to select specific ports and communication pathways in the IN. These communication pathways may be static after creation or dynamically changing during the software execution. When dynamic pathways are routed and torn down during normal operation, the optimization of the system can include the time dimension as well as space dimensions. Additionally, optimization of the system may be influenced by system constraints, e.g. run-time latency, delay, power dissipation, data processing dependencies, etc. Thus, the optimization of such systems may be a multi-dimensional optimization.

When fewer processors are involved, the assignment of application software tasks to physical locations and the specific routing of communication pathways may be relatively simple and may be done manually. Even so, the workload of each processor may vary dramatically over time, so that some form of dynamic allocation may be desirable to maximize throughput. Further, for MPAs with large numbers of PEs, this assignment and routing process can be tedious and error prone if done manually. To address these issues software development tools for multiprocessor systems may define tasks (blocks of program code) and communication requirements (source and destination for each pathway) and automatically allocate resources to tasks (place and route). If a design is large or contains many repeated tasks it may be more manageable if expressed as a hierarchy of cells. However, a hierarchical description will generally have to be flattened into a list of all the tasks and all the communication pathways that are required at run time before the place and route tools can be used to complete the assignment and routing process.

Figure 3:
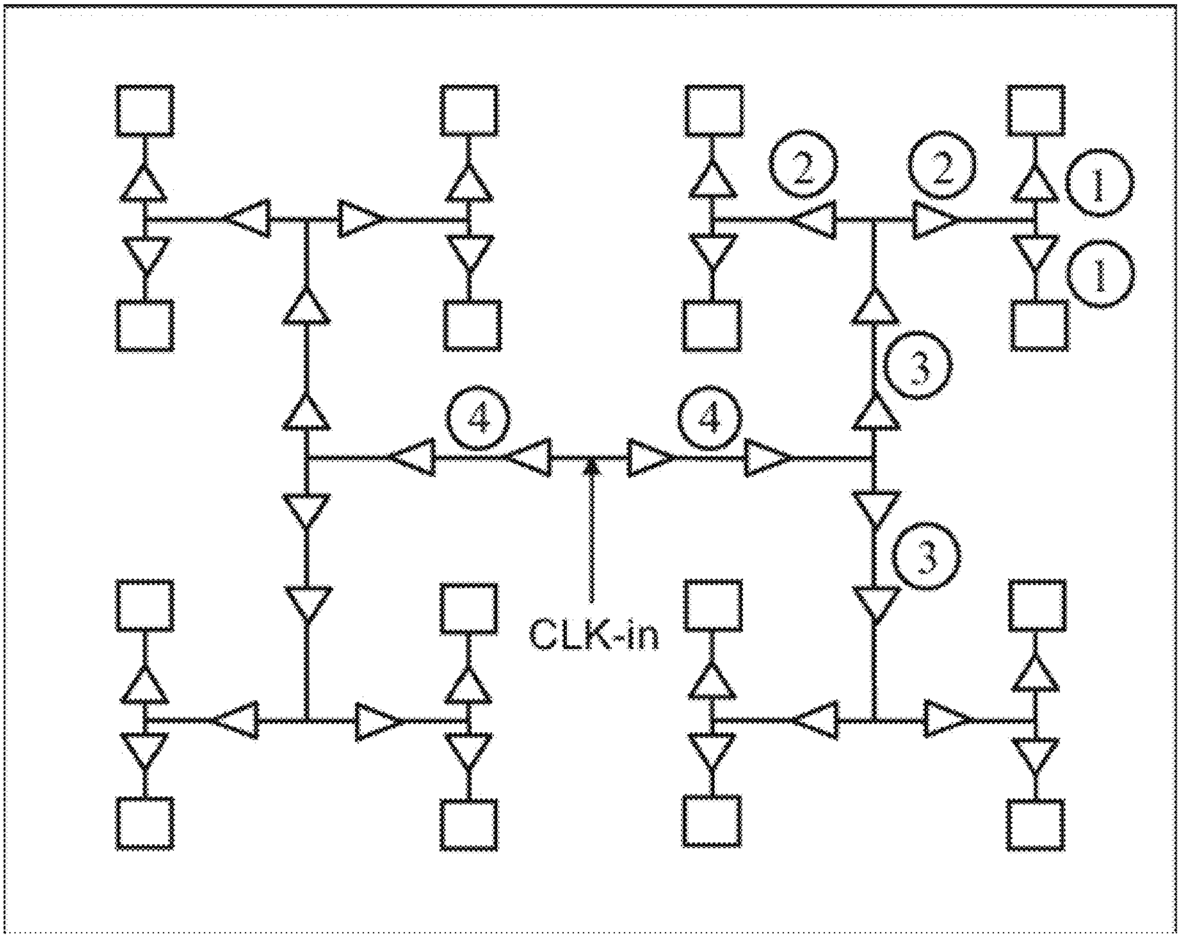
FIG. 3 illustrates an example of a 4×4 H-tree clock distribution network, according to some embodiment.

FIG. 3—H-Tree Clock Distribution Network

FIG. 3 is a schematic diagram illustrating an example layout for a 4-stage H-tree clock distribution network, according to some embodiments. CLK-in indicates where the clock signal is input to the array, and the squares represent processing elements of the array that are receiving a clock synchronization signal. The circled numbers indicate stages of the clock distribution network. Typically, a clock distribution network will have more than 4 stages, and FIG.

3 is intended to provide a simple illustrative example of how an H-tree clock distribution network may be organized. Note that while the global horizontal spine and the global vertical spine illustrated in FIGS. 8A and 8B, respectively, are shown in a rectilinear layout, in some embodiments the described modular global clock distribution network may be organized according to an H-tree structure.

Multi-Frequency Clocks

It is desirable for the PE, SM, IN, and clock distribution network for an MPA to be more power efficient per processor than for conventional microprocessors, simply because there are 10 to 100 times more processors in each MPA IC chip, and a reasonable chip size and package for it have a limited capacity to dissipate heat.

MPA clock distribution and control mechanisms also should be more flexible because with larger numbers of processors there is greater fluctuation in the instantaneous demand for their operation.

In multi-processor systems, processors can be configured to control the supply voltage and clocking frequency of other processors for the purpose of conserving overall power dissipation. A simple approach is to turn off the clock to processors that are temporarily not needed and for longer intervals to turn off their power. A more sophisticated approach involves preparing processors at low speeds for use at high speeds.

For a processor and memory, turning power back on and resuming processing is much more complicated than turning it off. When power comes up the processor is in a random state that requires a reset of the circuits followed by clock turn on. Then an initialization sequence is required to bring the processor to a known ready state, reload support memory, and begin execution of application software.

If all of this takes too long for the application, then it may be useful to prepare a processor at a low clock frequency (conserving power), so that it may resume full speed operation with only a few microseconds of advance notice.

Power Consumption

To see how energy can be conserved with parallel computing, we briefly review the ways that digital CMOS circuits use power. Basically the average power use depends on supply voltage and clocking frequency.

In CMOS digital circuits logical ones and zeroes are represented by high and low voltage levels on signal lines. The state of a signal line is high or low. Power is used to change (or switch) the state of each signal, otherwise the circuit sits in a quiescent state that dissipates a much smaller amount of power, which is due only to leakage currents. The energy required to switch a signal line from high to low or low to high is mostly proportional to the total electrical capacitance, C, of the line and the transistors connected to it. The power supply current required by a transistor to switch a signal line at first surges and then decays—much like the current through a switch to charge a capacitor. The integrated current through the transistor for the switching event (in amp*seconds) is equal to the change in the charge, Q, on the total capacitance, C. From the physics of capacitors, Q=C*V where C is in farads and V in volts. Repeated charging and discharging at some frequency f results in an average switching power of:

$$Pavg = I*\mathrm{V} = f*C*\mathrm{V}*\mathrm{V} = f*C*\mathrm{V}^2$$

This linear relation of power consumption to frequency holds over a wide range, many orders of magnitude. At very low frequencies there is a power floor where the dc leakage currents will dominate the overall power consumption. At very high frequencies the transistors are not fast enough to completely switch the signal lines, and this causes bit errors and excess supply current. Often the bit errors can be suppressed by increasing the V of the supply but this causes a quadratic increase in power until the circuits are damaged by overheating.

If a CMOS circuit does not need to run fast, then Pavg can be reduced by operation at lower frequency, and further reduced by reducing the supply voltage. However, operation at lower voltages results in less charge/discharge current per transistor. Below a threshold voltage, Vth, the transistors are off (except for tiny sub-threshold currents).

SUMMARY OF THE EMBODIMENTS

Designing high-performance multiprocessor systems has become more challenging than ever due to nanometer effects and local and global on-die variation. Interconnect delay has become a very significant effect and a small routing change in the design can increase coupling capacitances on neighboring paths and significantly increase path delays. This may cause new timing violations and result in design iterations. Timing convergence is getting harder and harder to achieve. Process variations result in interconnect variations, threshold voltage variations, leakage power variations, and/or Idsat variations. These effects not only generate reliability issues but also make the circuit performance deviate from the design specification and may cause timing yield losses. Due to the increasing process variations in nanometer technologies, timing yield has become an important design concern because it directly affects the manufacturing cost. Global and local clock distribution networks have a significant effect on both timing convergence and timing yield. Carefully designed clock distribution networks may reduce design-inherited clock skews, i.e., the discrepancies between designer intended clock skews and achieved clock skews under imperfect process conditions. This may improve circuit performance and timing convergence.

Various embodiments herein propose methods and apparatuses for global and local clock distribution networks that have been optimized to provide reduced delay, reduced rise and fall times, near perfect 50% duty cycle, low jitter and low power. Embodiments herein describe a dual-rail, zero-skew, stepped binary clock tree topology and the combination of a unique dual-rail clock buffer/repeater to provide improved performance over the full range of process corners as characterized by the nomenclature defined below: TT/FF/SS/FS/FSE/SF/SFE. Moreover, this may be accomplished without complex duty-cycle correction mechanisms and this may be accomplished for both local and global on-die variations. The industry standard nomenclature for characterizing process corners reflects a SPICE model variation that approximates the process variation during production where nfet=negative channel and pfet=positive channel transistors:

$TT$ – typical $nfet$ and typical $pfet$ $FF$ – fast (+15%) $nfet$ and fast (+15%) $pfet$ $SS$ – slow (−15%) $nfet$ and slow (−15%) $pfet$ $FS$ – fast (+15%) $nfet$ and slow (−15%) $pfet$ -continued

*FSE* real fast (+20%) *nfet* and real slow (−20%) *pfet*

*SF* – slow (−15%) *nfet* and fast (+15%) *pfet*

*SFE* – real slow (−20%) *nfet* and real fast (+20%) *pfet*

Simulation Program with Integrated Circuit Emphasis (SPICE) circuit simulations are used to confirm the behavior of a given design to process corners. A near optimum global clock distribution network would produce waveforms with ideal characteristics over these process corners. Furthermore, this near optimum global clock distribution network would produce ideal waveforms for global as well as local process variations. Existing implementations have struggled to meet this objective. A desirable clock waveform may be characterized as having low jitter, fast rise and fall times, low delay, zero-skew, 50% duty cycle, low power, no static power and tolerance to process variation. It is further desirable for a global clock distribution network to be easy and flexible to construct, small in layout area and ideally suited toward large die and small die system on chip designs. Moreover, it is desirable for a clock network topology to be applicable at the global chip level as well as in a hierarchical structure at the processor node level in a multiprocessor system design.

Dual-Rail Clock Buffer with Nonlinear Feed-Forward Equalization

Figure 4:
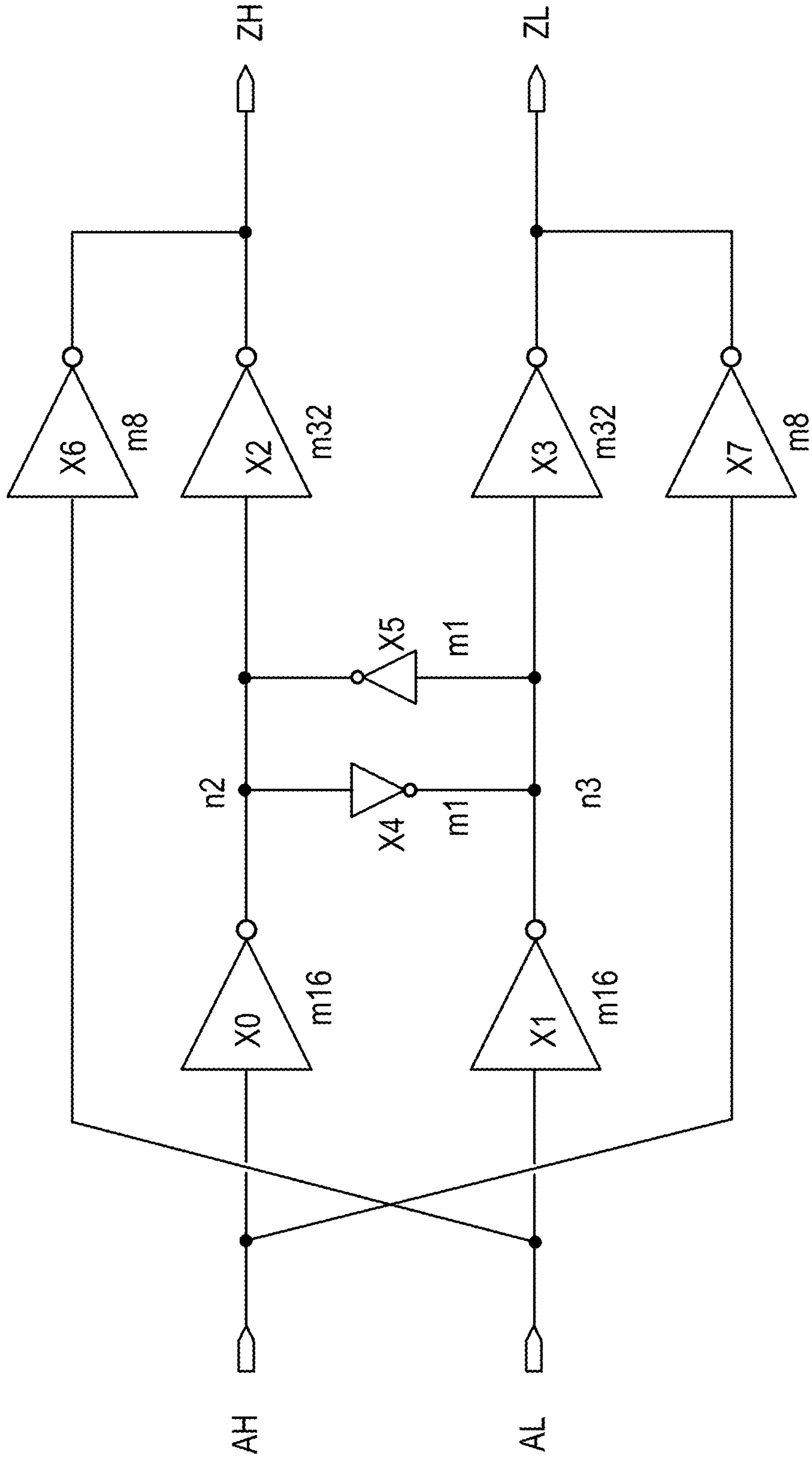
FIG. 4 is a circuit diagram for a dual-rail clock buffer with nonlinear feed forward equalization implemented with standardized cell subcircuits, according to some embodiments.

FIG. 4 is a schematic of the dual-rail clock buffer with nonlinear feed-forward equalization, according to some embodiments. Advantageously, the illustrated dual-rail clock buffer may be constructed with standardized cell subcircuits, where larger-gain inverters may be constructed from multiple parallel smaller-gain inverter units. The inverter units may be standardized to a particular gain.

In some embodiments, the dual-rail buffer circuit includes a first input port (AH) configured to receive a first input signal, a second input port (AL) configured to receive a second input signal, a first output port (ZH) coupled via a first channel to the first input and configured to output a first output signal, a second output port (ZL) coupled via a second channel to the second input and configured to output a second output signal.

The dual-rail buffer circuit may further include a zeroth inverter (X0) and a second inverter (X2) included within the first channel between the first input and the first output, a first inverter (X1) and a third inverter (X3) included within the second channel between the second input and the second output.

The dual-rail buffer circuit may further include a sixth inverter (X6) that is connected to the first channel after the zeroth and second inverters, where the sixth inverter is connected to the second channel before the first and third inverters.

The dual-rail buffer circuit may further include a seventh inverter (X7) that is connected to the first channel before the zeroth and second inverters, where the seventh inverter is connected to the second channel after the first and third inverters.

The feed-forward positive cursor output (ZH) is generated from the AH input via the signal path of X0 and X2 and the negative cursor output (ZL) is generated from the AL input via the signal path of X1 and X3. The positive pre-cursor is generated from the AL by the X6 devices, and its output is summed at the ZH output. Therefore, when the AH input begins to switch, X0 will drive n2 and X2 will drive ZH in opposite directions, using pfets to source, and nfets to sink, currents to/from nodes n2 and ZH. If the AL input is a rising edge coincident with an AH falling edge, the X6 device will sink current from ZH through an nfet ahead of X2 and accelerate ZH switching. If the AL input is a rising edge ahead of an AH falling edge, the X6 device will sink current from ZH even sooner; and will help sink any feedthrough from X2 gate to drain capacitances, $C_{gd}$. If the AL input is a rising edge delayed from an AH falling edge by an X0 propagation delay, the X6 device will coincidently aid X2. If the AL input is a rising edge delayed from an AH falling edge by the propagation delay of both X0 and X2, then ZH switching is no longer aided by X6 (unless there is a heavy capacitive load on ZH). The negative pre-cursor output is generated by the X7 device and its output is summed at the ZL output.

Therefore, when the AL input begins to switch, X1 will drive n3 and X3 will drive ZL in opposite directions, using pfets to source, and nfets to sink, currents to/from nodes n3 and ZL.

If the AH input is a falling edge coincident with an AL rising edge, the X7 device will source current to ZL through a pfet ahead of X3 and accelerate ZL switching.

Only when the AH input is delayed from an AL rising edge by more than the propagation delay of both X1 and X3 will the ZL switching no longer be aided by X7 (unless there is a heavy capacitive load on ZL).

The combined effect of X6 and X7 is to accelerate the switching of ZH and ZL, respectively. However, if one of the inputs is delayed sufficiently the acceleration is reduced on the opposite leg (if AL arrives late then ZH is not accelerated, and if AH arrives late then ZL is not accelerated). Thus, the combined effect is to bring the ZH and ZL edges closer in time. When there are long strings of many of these buffers the effect is more pronounced to bring the ZH and ZL edges more coincident.

The feed-forward equalizer is a fractional feed-forward equalizer because the pre-cursor delay devices (X6 and X7) generate a fraction (approximately ½ as illustrated, although other fractions may also be used, as desired) of the full delay (e.g., the delay from X0+X2 and X1+X3) of the cursor outputs. By having a fractionally smaller delay, X6 and X7 may preemptively add to the ZH current a contribution originating from the AL input, which equalizes the duty cycle toward a desired 50/50 split. Similarly, X7 adds a contribution from AH to the ZL output to equalize the ZL duty cycle. Advantageously, the X6 and X7 devices may reduce both local and global discrepancies in the duty cycle.

In some embodiments, the dual-rail buffer circuit may further include a fourth inverter (X4) and a fifth inverter (X5) coupled to the first channel and the second channel, where the fourth and fifth inverters are coupled to the first channel in between the zeroth and second inverters, the fourth and fifth inverters are coupled to the second channel in between the first and third inverters, and the fourth and fifth inverters are coupled to the first and second channels with opposite polarity.

In some embodiments, the fourth and fifth inverters have a first strength (e.g., ml) that is less than respective strengths of the zeroth, first, second, third, sixth and seventh inverters. These small devices X4 and X5 may be used to help symmetrize the generated output waveforms, ZH and ZL. The X4 and X5 devices may assist in adjusting the crossover of the ZL and ZH outputs to occur closer to the middle of the transition period.

In some embodiments, the zeroth inverter has a first strength (m16) that is half as large as a second strength (m32) of the second inverter, and the first inverter has a third strength (m16) that is half as large as a fourth strength (m32) of the third inverter.

In some embodiments, the zeroth inverter has a first strength (m16) that is twice as large as a second strength (m8) of the seventh inverter, and the first inverter has a third strength (m16) that is twice as large as a fourth strength (m8) of the sixth inverter.

Figure 8A:
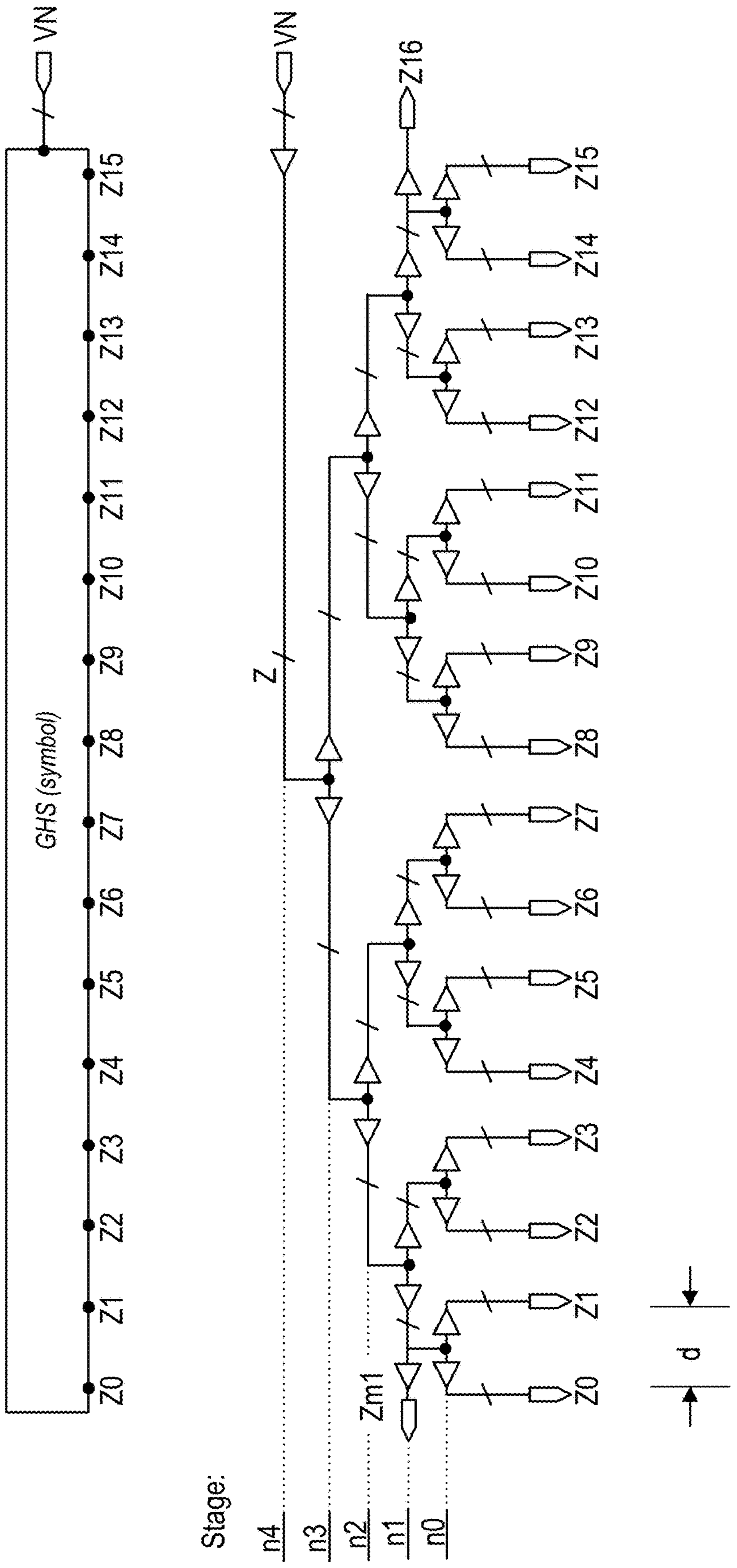
FIG. 8A illustrates a global horizontal spine (GHS) for a dual-rail stepped binary tree clock distribution network, according to some embodiments.
Figure 8B:
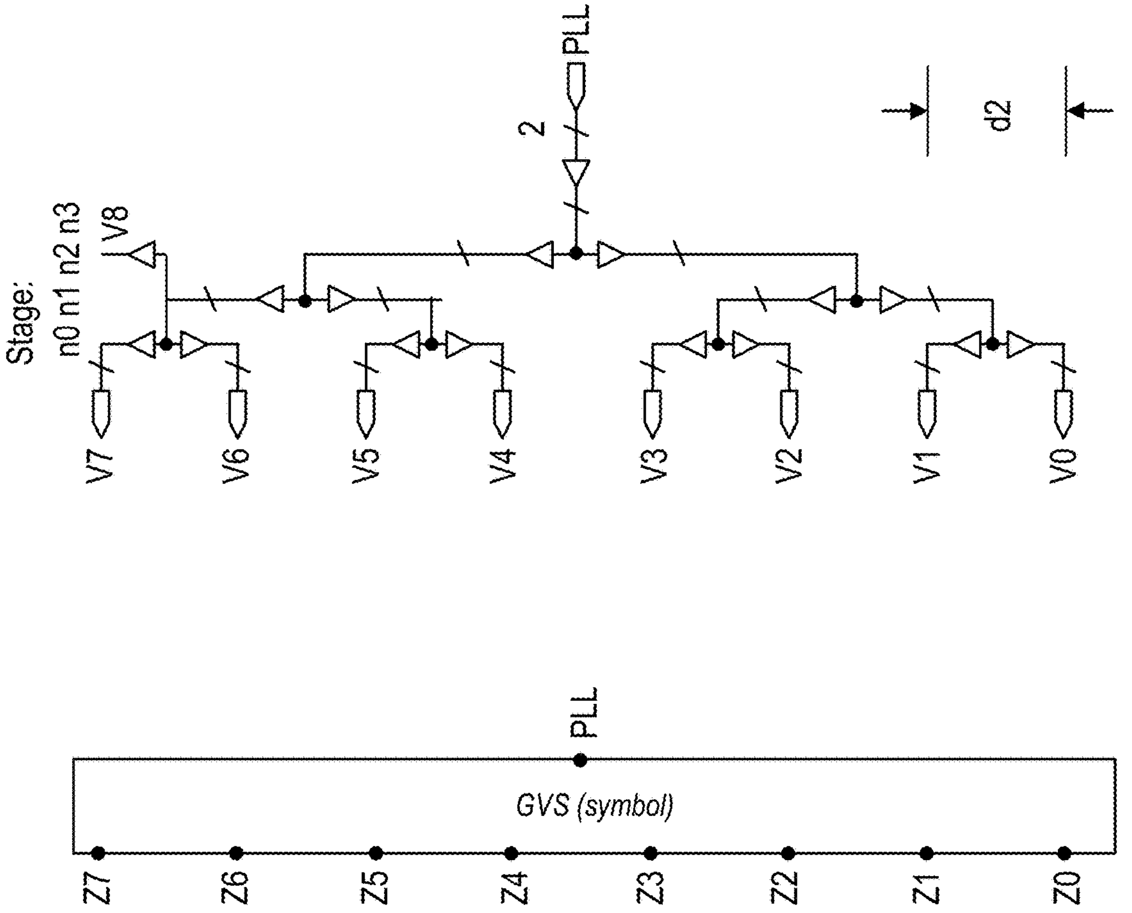
FIG. 8B illustrates a global vertical spine (GVS) for a dual-rail stepped binary tree clock distribution network, according to some embodiments.
Figure 9:
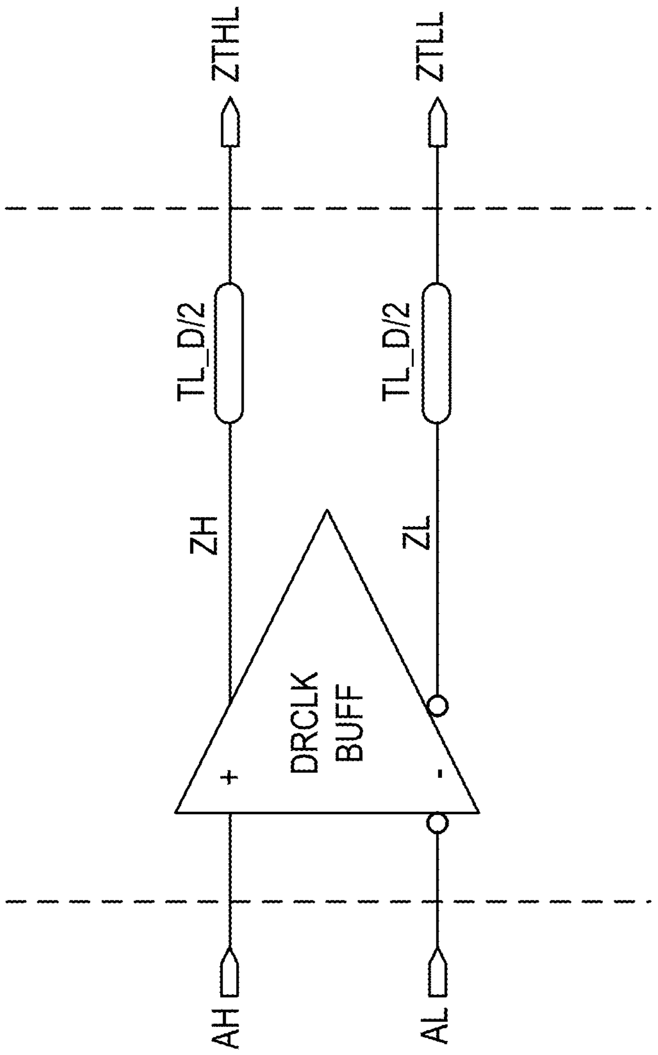
FIG. 9 illustrates a clock network leafcell that includes a dual-rail clock buffer with nonlinear feed forward equalization and a transmission line segment, according to some embodiments.

In some embodiments, the dual-rail buffer circuit is configured within a global clock distribution network. In some embodiments, the dual-rail buffer circuit is configured within the global clock distribution network as a modular unit comprising the dual-rail buffer circuit and a transmission line. For example, the modular unit shown in FIG. 9 may be used, which includes a transmission line "TL_D/2" on both of the high and low rails, and a plurality of these units may be used to construct the global horizontal spine or the global vertical spine, as shown in FIGS. 8A and 8B, respectively.

In some embodiments, the sixth and seventh inverters provide fractional nonlinear feed-forward equalization to the first and second outputs.

In some embodiments, the zeroth and first inverters each include two respective inverters connected in parallel having a same strength (m8) as the sixth and seventh inverters, and the second and third inverters each include four respective inverters connected in parallel, each respective inverter having the same strength (m8) as the sixth and seventh inverters.

An inverter is a nonlinear device, but during the transition from positive to negative or negative to positive there is short interval where the inverter acts like an analog inverting amplifier. The feed-forward devices X6 and X7 operate as both linear (during transition) and nonlinear (outside of transition) devices.

The relative sizing of the devices (in terms of gain) is indicated in the Figures by the lower case letter m. The primary output drives X2 and X3 are sized as 32×, where x is a standard unit of gain. The predriver devices (X0 and X1) are sized as 16×. The small cross-coupled devices X4 and X5 are 1× in size. The Pre-Cursor devices X6 and X7 are sized as 8×. Other gain values for each of the inverters may also be used, as desired. In the integrated circuit layout of this buffer the output devices X2 and X3 are implemented as 4 instantiations of 8× cells (4×8×=32×). The input devices X0 and X1 are implemented as 2 instantiations of 8× cells (2×8×=16×). The pre-cursor devices may be instantiated as 1×8× cell (1×8×=8×). Therefore, two unique cell sizes are utilized for a 1× device and an 8× device, and the larger sizes are implemented as arrays of these two sizes. This is illustrated in the layout floor plans of this buffer shown in FIGS. 5A-B.

The devices in combination with the small cross-coupled devices are responsible for this buffer's unique ability to generated symmetric, fast rise and fall times, minimum delay and large signal which is necessary for producing low jitter and near 50% duty cycle clock waveforms. In effect, skew is reduced or eliminated at each repeater and buffer stage of the global vertical spine and through the global horizontal spines.

Figure 5A:
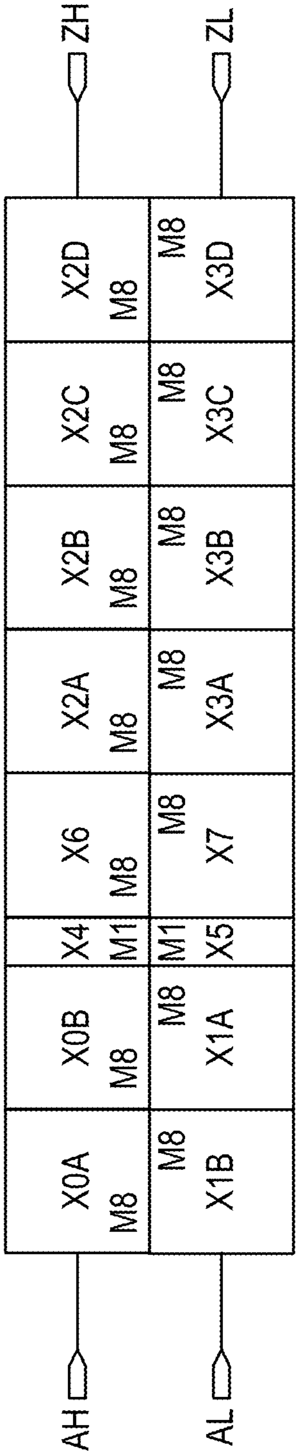
FIG. 5A illustrates a dual-rail clock buffer with nonlinear feed forward equalization layout floorplans for the global horizontal spine, according to some embodiments.
Figure 5B:
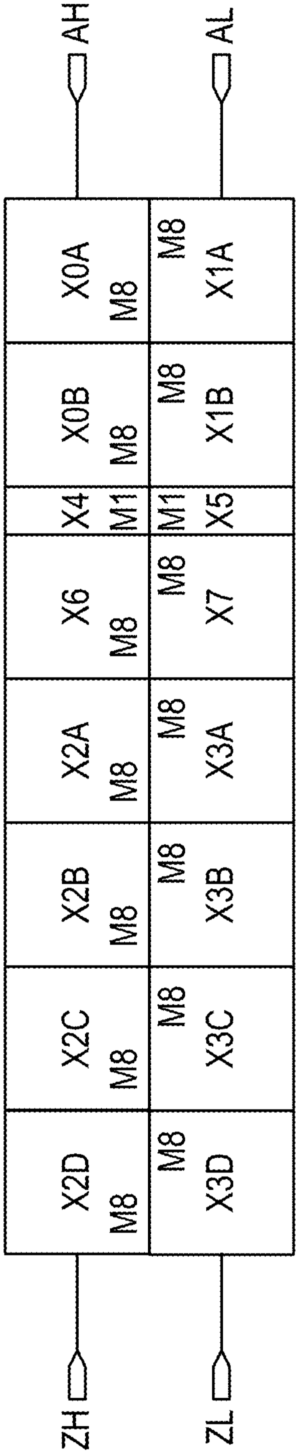
FIG. 5B illustrate a dual-rail clock buffer with nonlinear feed forward equalization layout floorplans for the global horizontal spine, that is flipped 180 degrees relative to FIG. 5A, according to some embodiments.

FIGS. 5A-B illustrate the dual-rail clock buffer with nonlinear feed forward equalization layout floorplans for the global horizontal spine. A zero-degree version (FIG. 5A) and a flipped 180-degree version (FIG. 5B) may be utilized to generate the desired wire route. As illustrated, multiple copies (e.g., X0A and X0B) of inverter units of a standard size (e.g., m8 in the illustrated example) may be used to larger gain values (e.g., m16 for the combination of X0A and X0B). In some embodiments, the height of a single inverter may be roughly ½ of a micron, such that the total height of the dual-rail clock buffers illustrated in FIGS. 5A-B is twice that, or roughly 1 micron.

Figure 6:
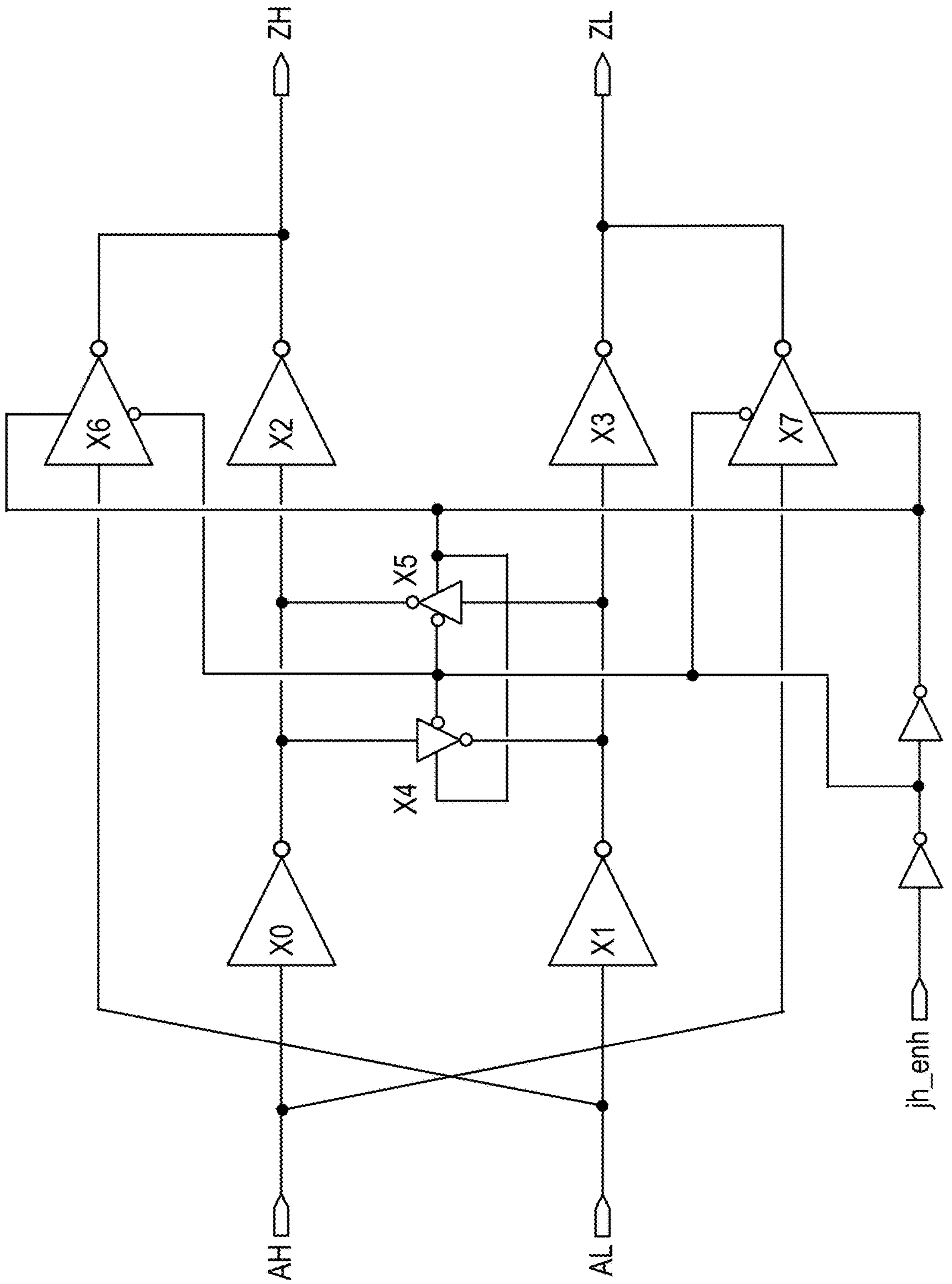
FIG. 6 is a circuit diagram illustrating a dual-rail clock buffer with nonlinear feed forward equalization implemented with tri-state buffers to enable/disable the equalization, according to some embodiments.

FIG. 6 illustrates a dual-rail clock buffer with nonlinear feed forward equalization implemented with tri-state buffers to enable/disable the equalization. As illustrated, an additional "enable" input current (jh_enh) is utilized and connected to the X4, X5, X6, and X7 tri-inverters. The value of the enable input current may be controlled to enable and disable the impact of the four tri-inverters on the circuit, e.g., to activate or disable the effect of these inverters on the current passing through.

Figure 7:
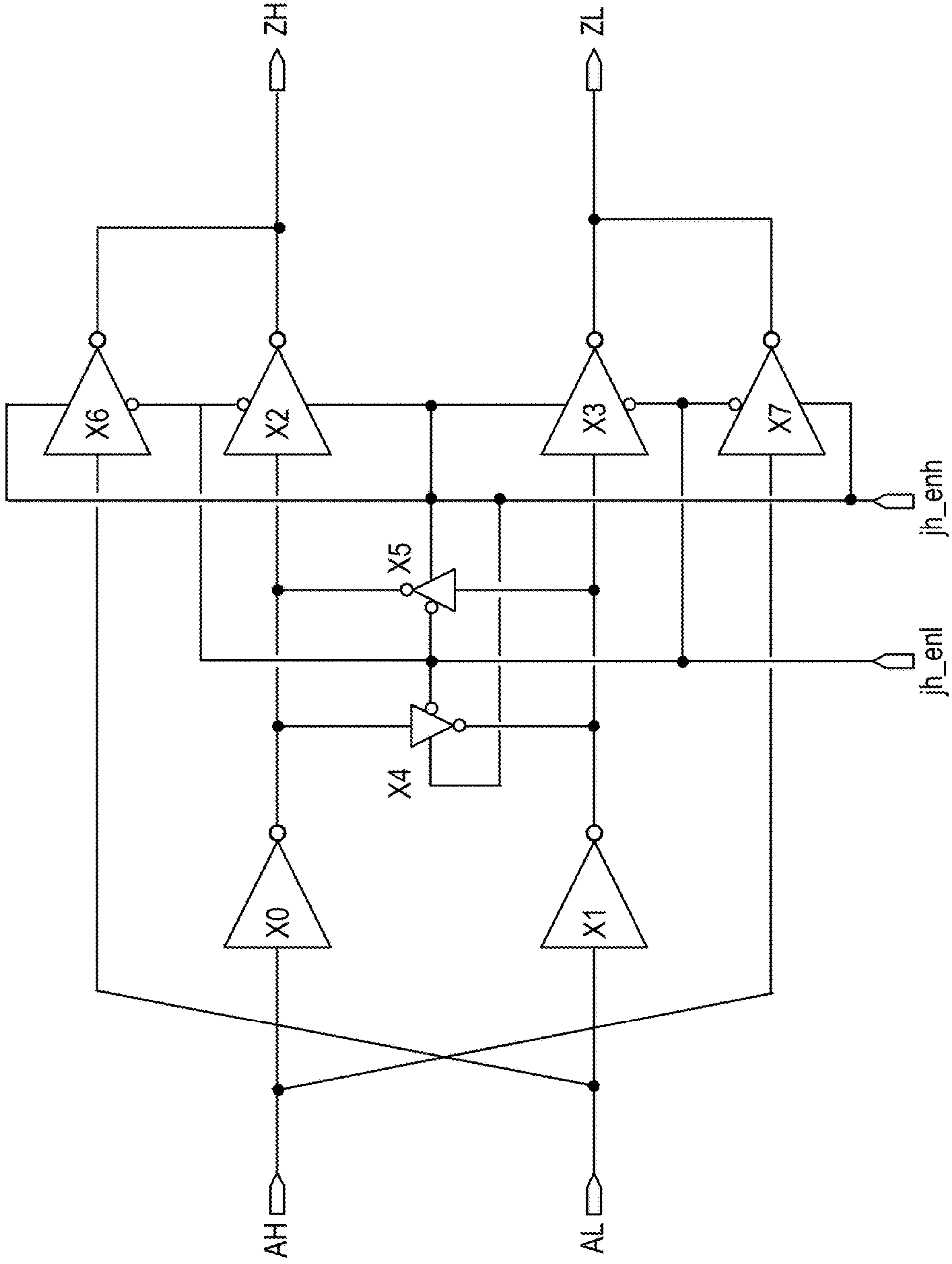
FIG. 7 is a circuit diagram illustrating a dual-rail clock buffer with nonlinear feed forward equalization implemented with tri-state buffers to enable/disable the equalization and the output driver, according to some embodiments.

FIG. 7 illustrates a dual-rail clock buffer with nonlinear feed forward equalization implemented with tri-state buffers to enable/disable the equalization and the output driver. FIG. 7 is similar in some respects to FIG. 6, with the difference that both a high (jh_enh) and a low (jh_enl) enable input current are utilized, the X2 and X3 inverters are replaced with tri-inverters, and the X2 and X3 tri-inverters are also connected to the enable input currents. Accordingly, the high and low enable input currents may be controlled to enable and disable all six of the tri-inverters, to enable/disable both the equalization and the output driver.

Modular Global Clock Distribution Network

In some embodiments, a multi-processor array includes a plurality of processing elements, a plurality of non-transitory memory media interspersed among the plurality of processing elements, and the modular global clock distribution network described in any of the following paragraphs.

In some embodiments, a modular global clock distribution network includes a plurality of standardized units and a plurality of T connections. Each standardized unit may include a buffer coupled to a transmission line, such as that illustrated in FIG. 9. The standardized unit shown in FIG. 9, or a similar standardized unit, may be referred to as a "leafcell". When a leafcell is repeated along the circuit, it can be referred to as a "repeater". The standardized units and the T connections may be configured in a tree structure that includes a plurality of stages. In some embodiments, the tree structure is a binary tree structure.

The modular global clock distribution network may be configured to provide synchronized timing information to each of a plurality of circuit modules. In some embodiments, the circuit modules are part of a multiprocessor array and include one or both of processing elements and data memory routers (DMRs). Two examples of a modular global clock distribution network are shown in FIGS. 8A (global horizontal spline) and 8B (global vertical spline), and are described in greater detail below.

In some embodiments, the plurality of stages include m+1 stages for stages n={0, 1, . . . , m} for a positive integer m. For each respective stage n excepting the $m^{th}$ stage, the respective stage comprises a respective T connection coupled to two respective branches and the respective n+1 stage. Each respective branch comprises 2n respective standardized units connected in series.

In some embodiments, the length of the standardized units is determined based at least in part on a pitch length of the circuit modules. For example, the length of the standardized units may be selected such that, at the $m^{th}$ stage (i.e., the final stage that includes the "leaves" of the tree structure), the total combined length of the standardized units in the $m^{th}$ stage is equal to (or substantially equal to) the total pitch length of a row or column of circuit modules for which the global clock distribution network is providing synchronized timing information. In some embodiments (in particular when the tree structure is a binary tree structure), the length of the standardized units is substantially equal to one half of the pitch length of the circuit modules. In some embodiments, the circuit modules are part of a multiprocessor array, and the pitch length of the circuit modules is a repetition distance of the circuit modules in the multiprocessor array.

In some embodiments, each buffer comprises a dual-rail fractional feed-forward equalization buffer. For example, the buffers may be constructed according to the circuit diagrams in any of FIGS. 4-7, or another type of buffer may be used.

In some embodiments, the plurality of stages are stacked in layers, where each layer has a thickness equal to the thickness of the standardized units. For example, in reference to the GHS shown in FIG. 8A, the leafcells in each stage may be collapsed down layers, where each layer has a height equal to the height of an individual dual-rail buffer (For a 1 micron height dual-rail buffer, the total height of the illustrated GHS may then be roughly 5 microns). This may significantly reduce the area footprint of the GHS. Similarly, the GVS shown in FIG. 8B may be collapsed into layers along the horizontal direction in a similar manner. When the GHS or GVS uses the dual-rail buffers shown in FIGS. 5A-B, each standardized unit has a height (or width) of two inverter units (note that a GVS may rotate the dual-rail buffers shown in FIGS. 5A-B by 90°).

The dual-rail buffer in combination with the transmission wiring that it drives is used as the primary building block (leafcell) of the global clock distribution network horizontal spine (FIG. 8A) and the global vertical spine (FIG. 8B). Note that the repeaters in the tree for n greater than zero are not all shown in FIGS. 8A and 8B. For example, in stage n=1 for each connection to the n=0 stage there may be two leafcells in tandem, in the n=2 stage for each connection to the n=1 stage there may be four leafcells in tandem, and so forth to the top of the hierarchy. For simplicity, the Figures use a slash to indicate the appropriate number of additional repeaters, which are not explicitly illustrated to avoid clutter. These extra cells in tandem maintain fast edge rates on the longer connection distances at higher levels of the hierarchy.

The global horizontal spine schematic is illustrated in FIG. 8A and stages are indicated as stages n0, n1, n2, n3 and n4, with 16+2 output taps. Similarly, the global vertical spine is illustrated in FIG. 8B and the stages are indicated as stages number n0, n1, n2, n3, with 8+1 output taps. The horizontal spine transmission line wire length that is concatenated with the dual-rail buffer is approximately given by one half of the width of the Processor width, d. The vertical transmission line wire length that is concatenated with the dual-rail buffer is approximately one half of the height of the processor element height, d2. For the example processor array and global clock network described here, the total number of repeater/buffers in the network from the phase-locked loop (PLL) output to the processor clock input is 24.

This assumes that the dimensions of the processor core dimensions are 360u×360u. In this example design, the transmission wire length is 180u for both the horizontal and the vertical spine networks. The dual-rail clock buffer with nonlinear feedforward equalization corrects for clock skew at each stage of the global clock distribution network along the 24 buffer/repeater path. The dual-rail clock buffer with nonlinear feedforward equalization also maintains a fast rise and fall time and maintains a near perfect 50% duty cycle along each of the 24 buffer/repeater cascaded network of the global clock distribution network.

Figure 10A:
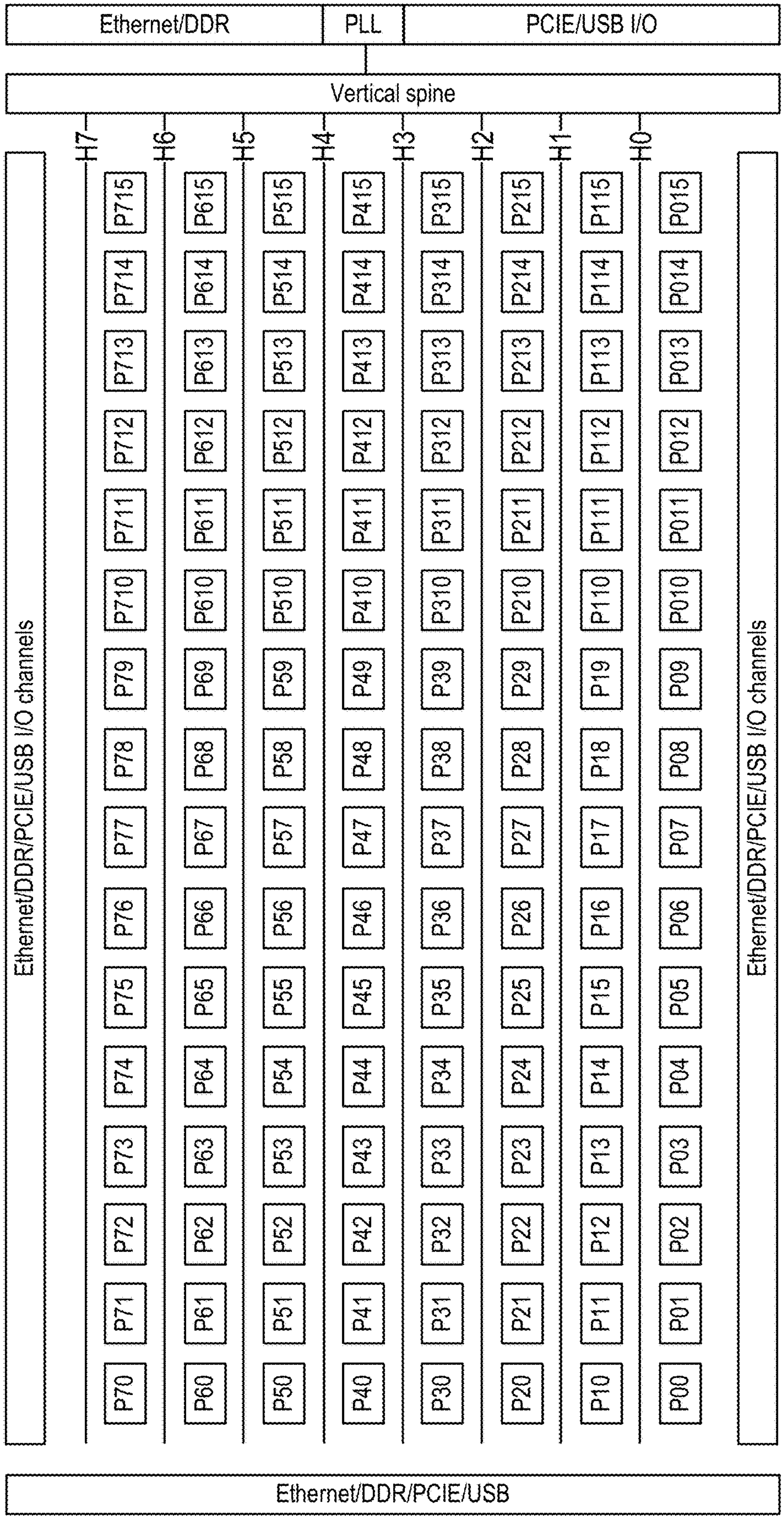
FIG. 10A illustrates a multiprocessor array with 8 global horizontal spines and 1 end-fire global vertical spine, according to some embodiments.
Figure 10B:
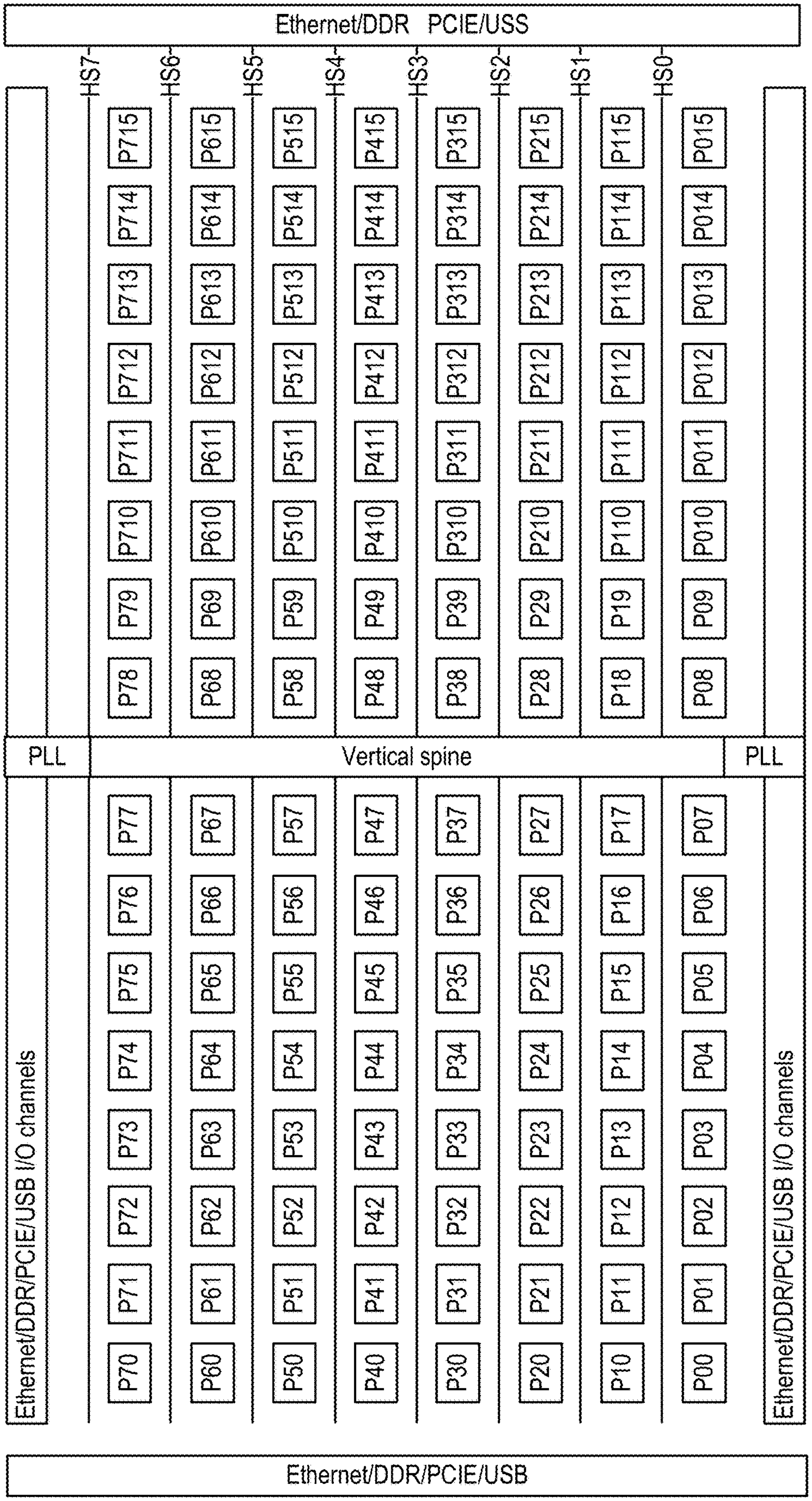
FIG. 10B illustrates a multiprocessor array with 8 global horizontal spines and 1 centered global vertical spine, according to some embodiments.
Figure 10C:
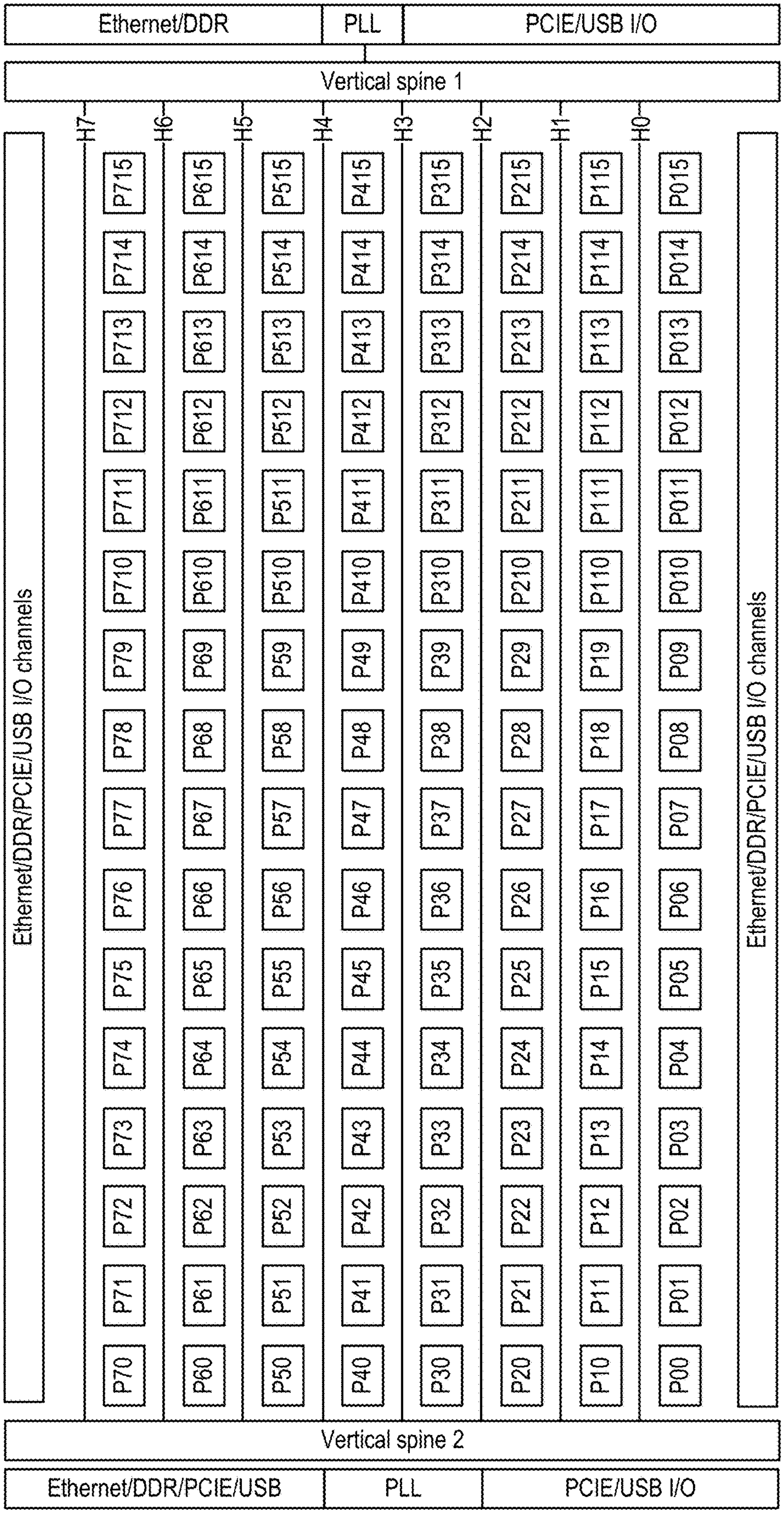
FIG. 10C illustrates a multiprocessor array with 8 global horizontal spines and 2 end-fire global vertical spines, according to some embodiments.
Figure 11A:
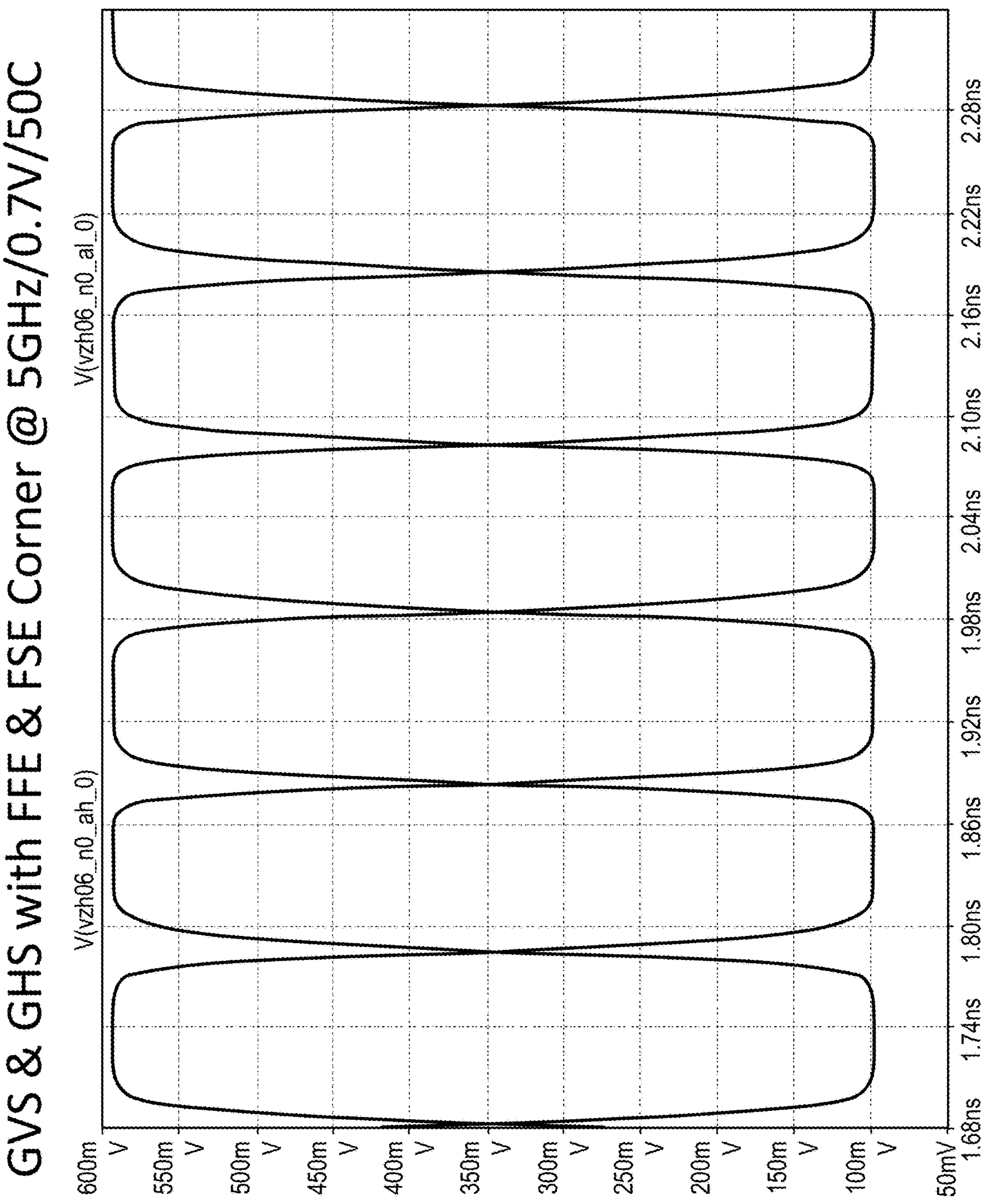
FIG. 11A shows a plot of global clock distribution network output with nonlinear feed forward equalization at 5 GHz/0.7V/50 C clock output, according to some embodiments.
Figure 11B:
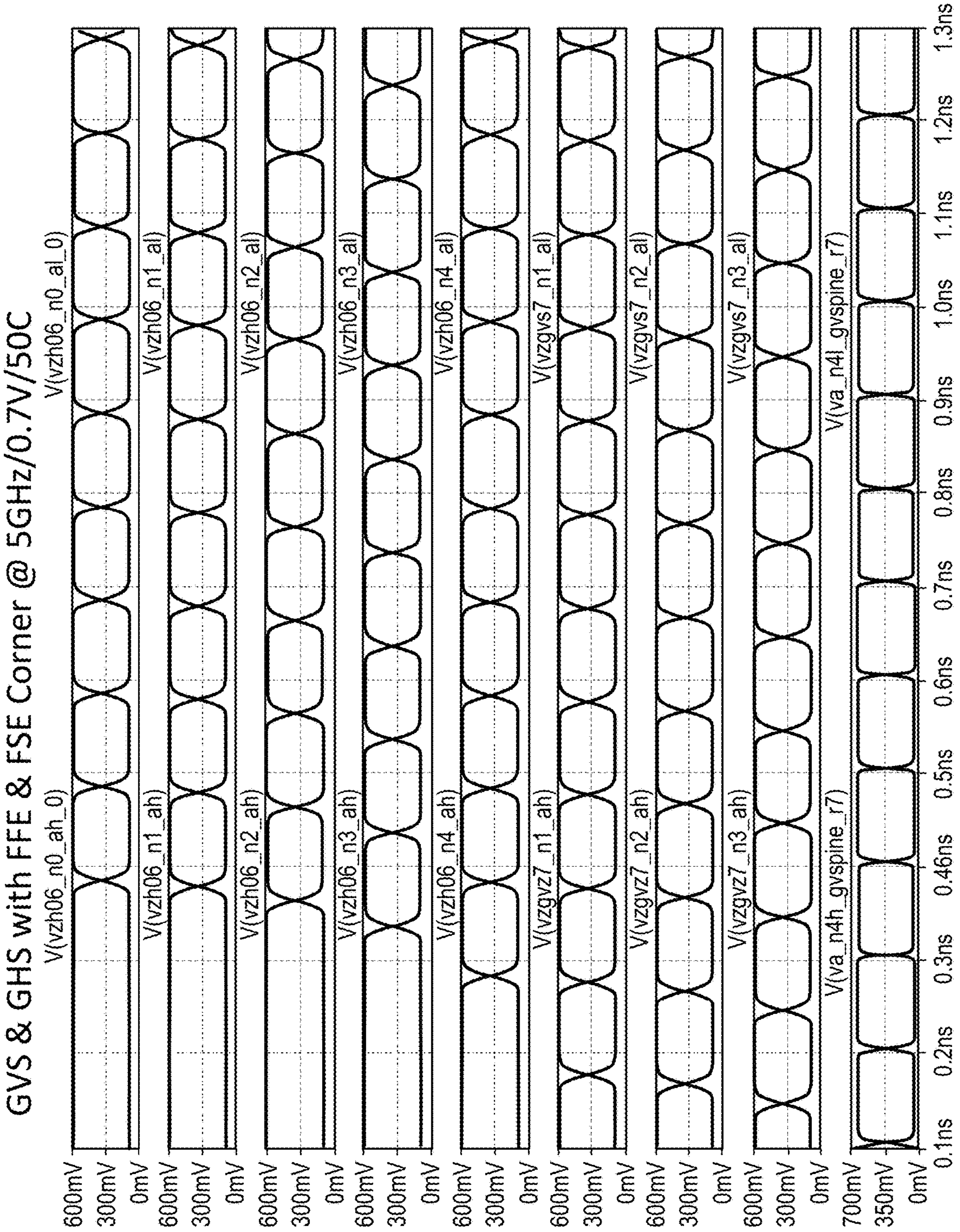
FIG. 11B shows a plot of global clock distribution network stage outputs with nonlinear feed forward equalization at 5 GHz/0.7V/50 C with dual-rail outputs for each GVS and GHS stage, according to some embodiments.
Figure 11C:
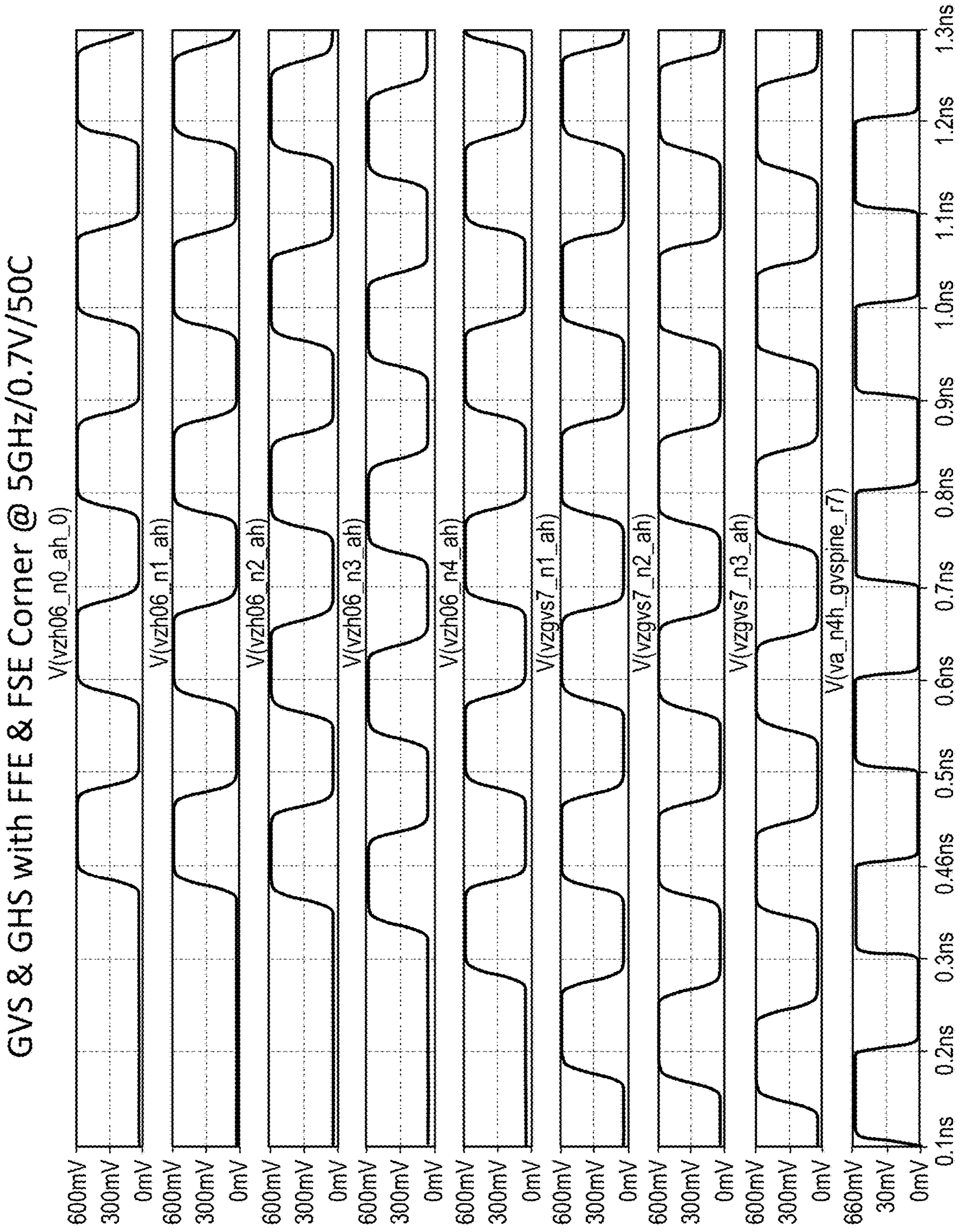
FIG. 11C shows a plot of global clock distribution network stage outputs with nonlinear feed forward equalization at 5 GHz/0.7V/50 C with a single-ended waveform only for each GVS and GHS stage, according to some embodiments.
Figure 11D:
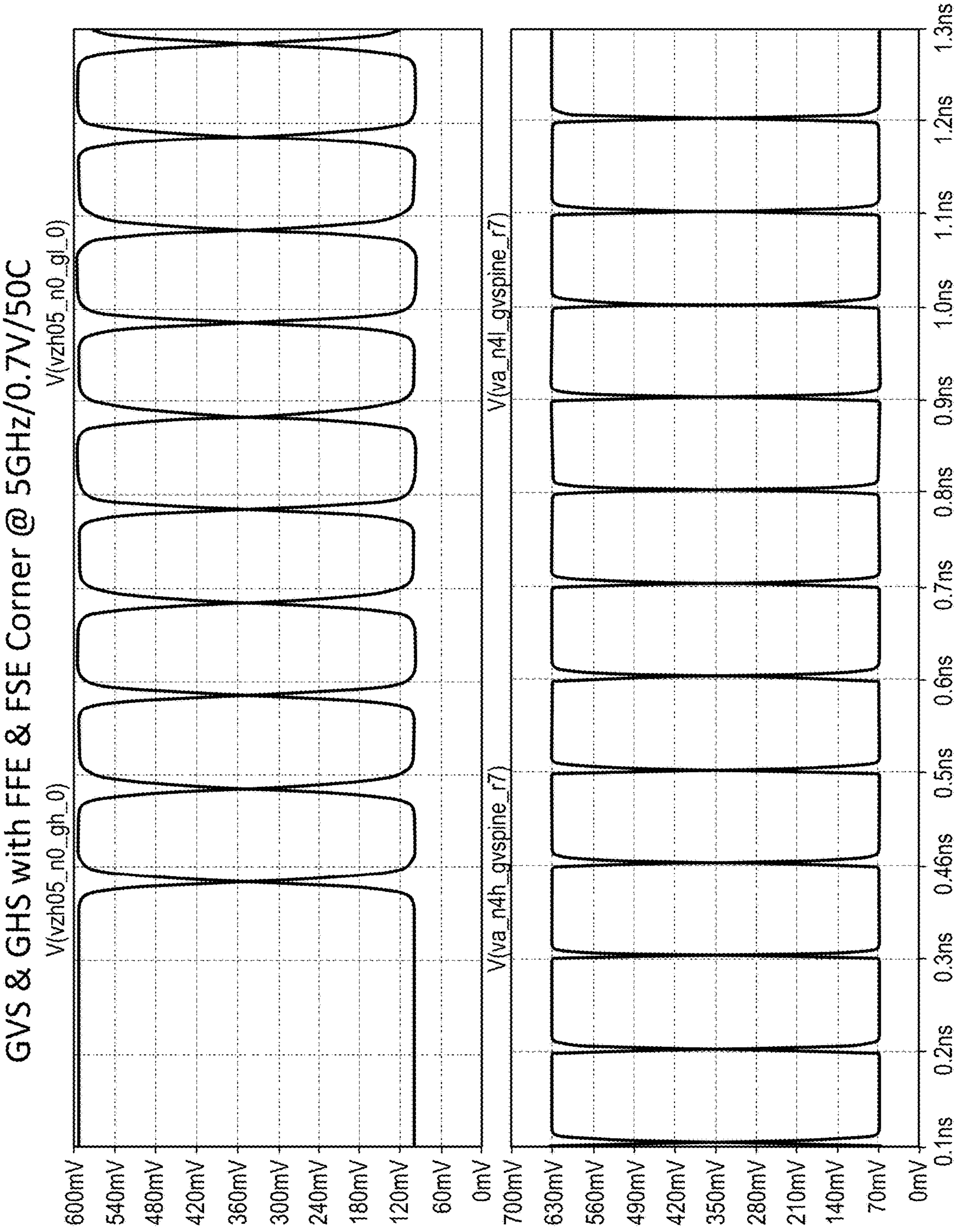
FIG. 11D shows a plot of global clock distribution network stage output with nonlinear feed forward equalization at 5 GHz/0.7V/50 C with input clock and output clock waveforms, according to some embodiments.
Figure 11E:
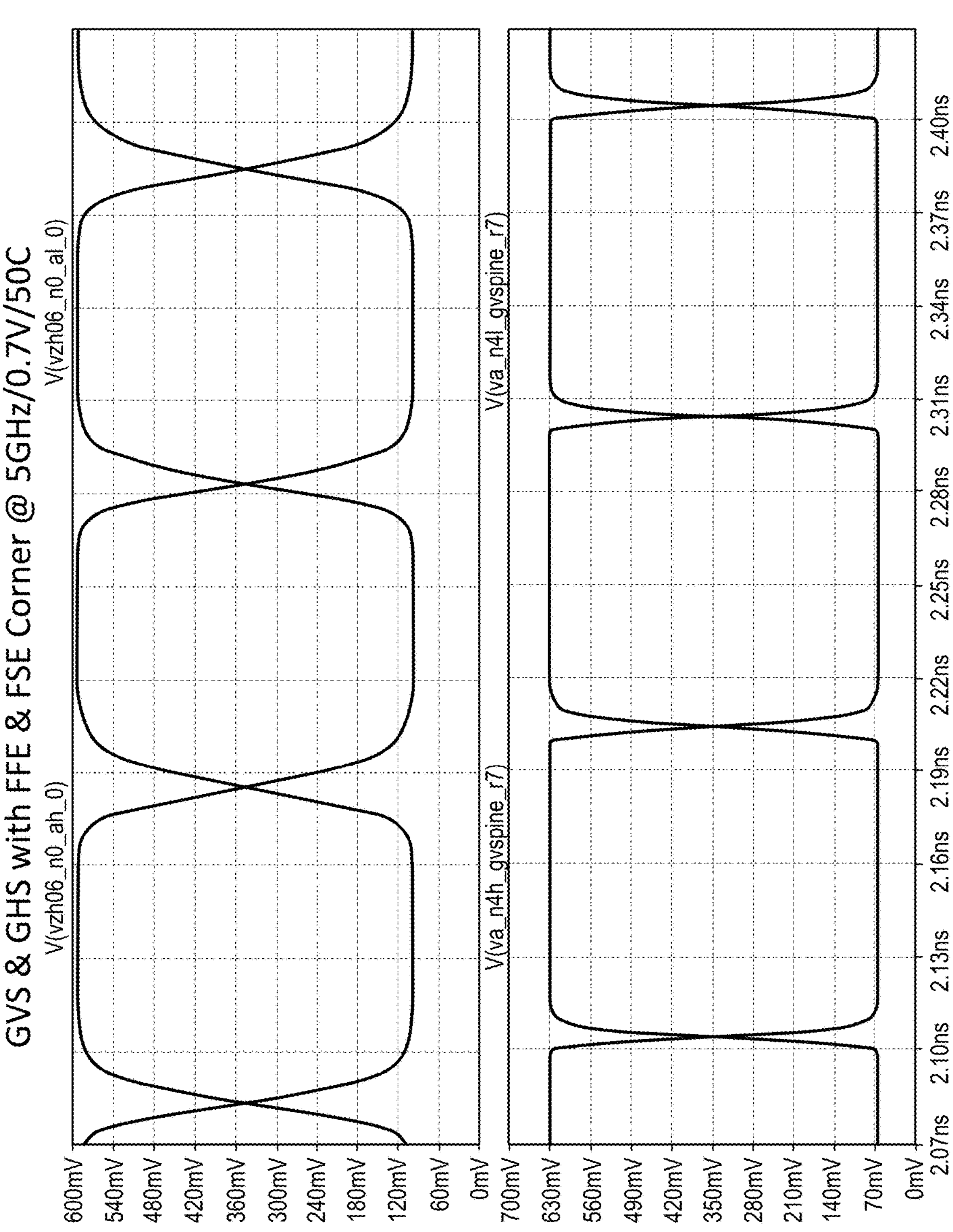
FIG. 11E shows a plot of global clock distribution network stage output with nonlinear feed forward equalization at 5 GHz/0.7V/50 C with zoomed in input clock and output clock waveforms, according to some embodiments.
Figure 12A:
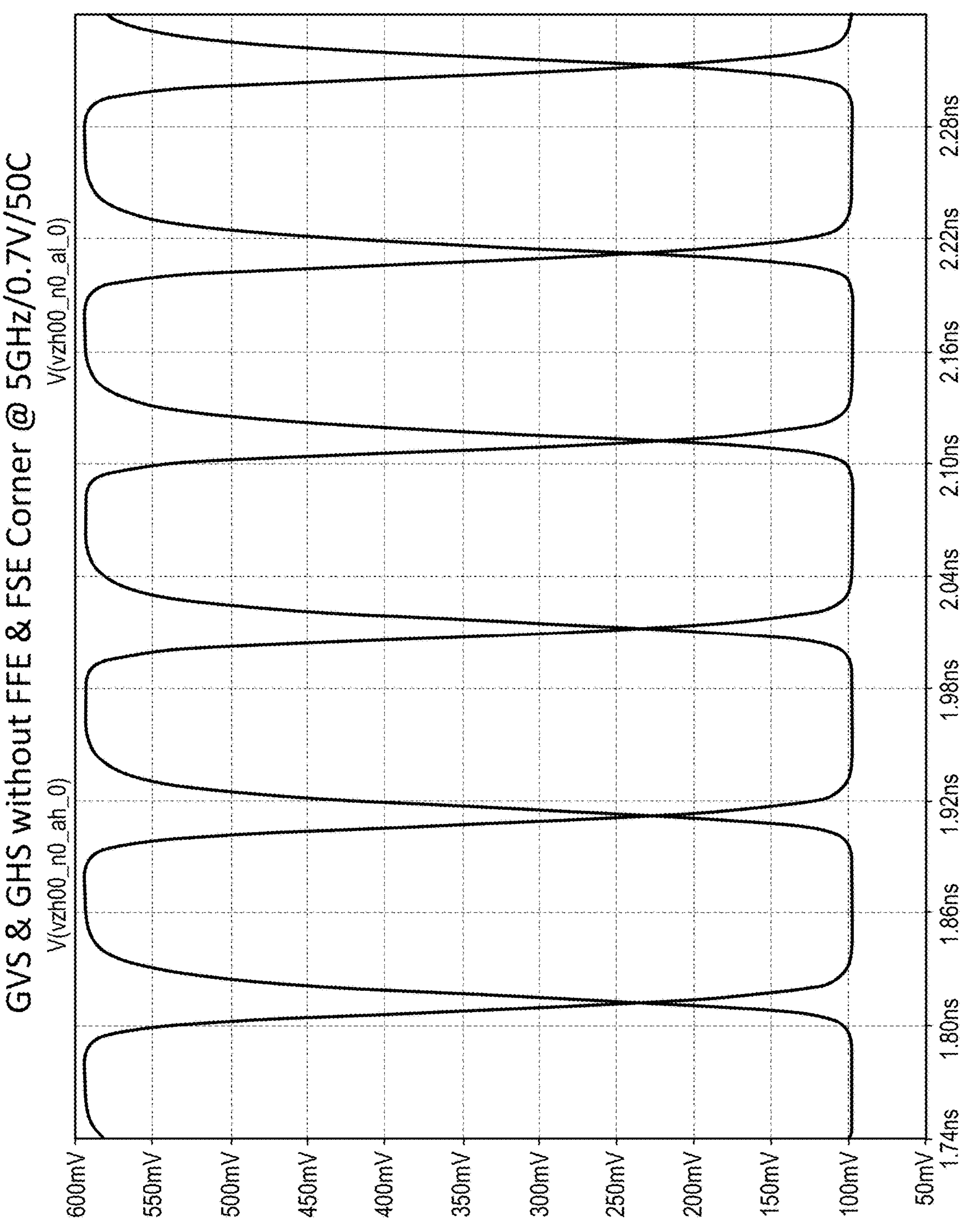
FIG. 12A shows a plot of global clock distribution network output without nonlinear feed forward equalization at 5 GHz/0.7V/50 C clock output through the entire GVS and GHS, according to some embodiments.
Figure 12B:
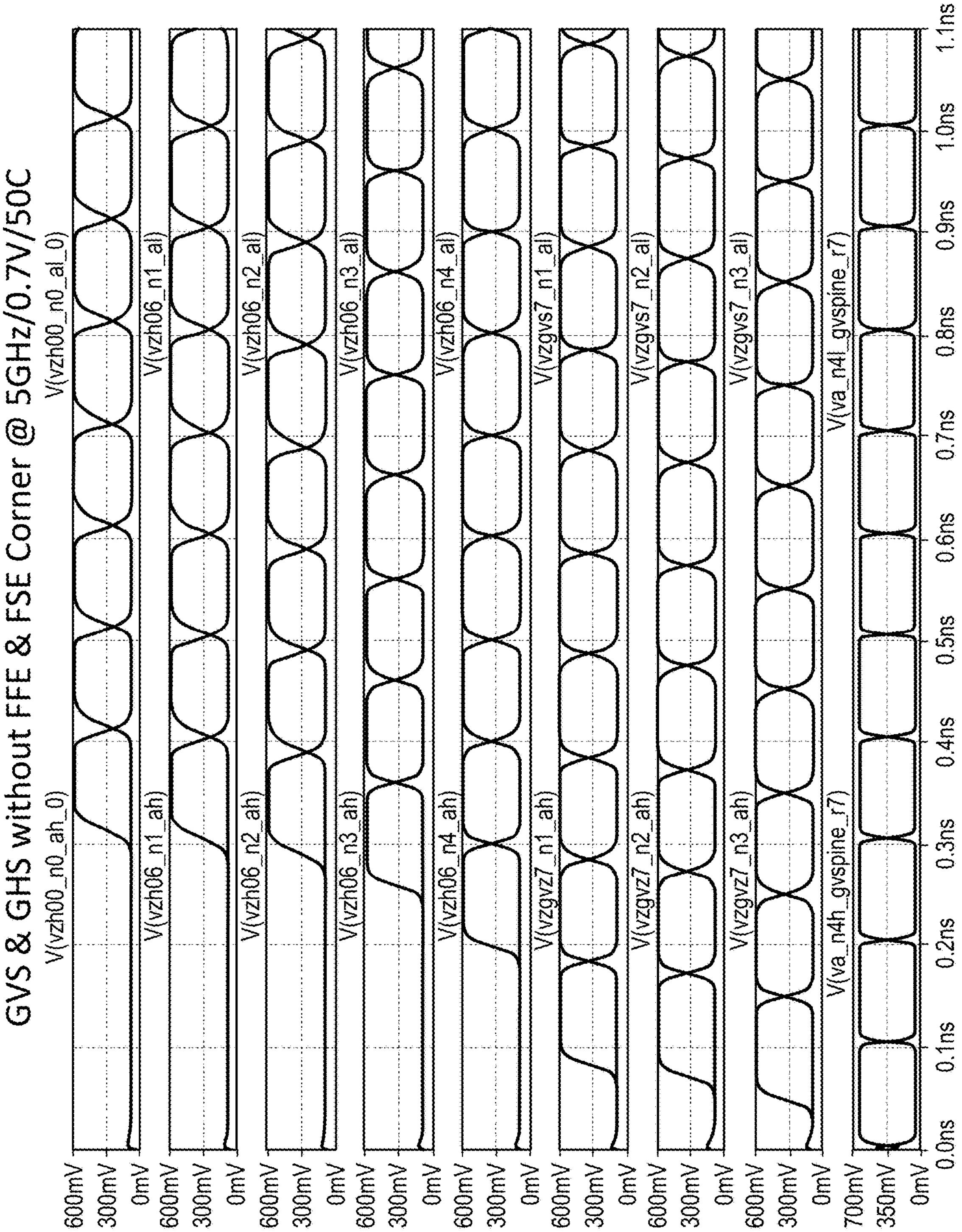
FIG. 12B shows a plot of global clock distribution network stage outputs without nonlinear feed forward equalization at 5 GHz/0.7V/50 C with dual-rail outputs for each GVS and GHS stage, according to some embodiments.
Figure 12C:
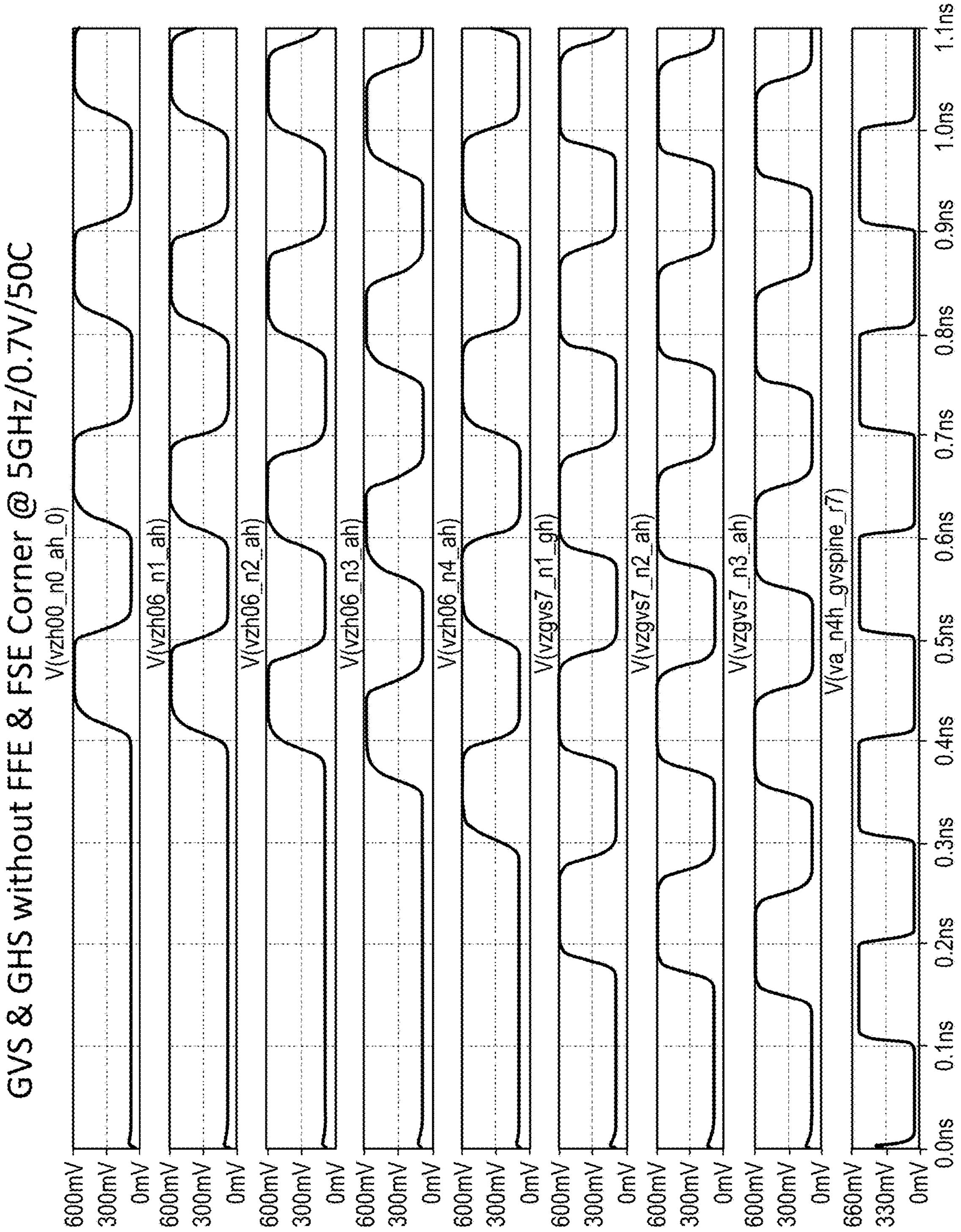
FIG. 12C shows a plot of global clock distribution network stage outputs without nonlinear feed forward equalization at 5 GHz/0.7V/50 C with a single-ended waveform only for each GVS and GHS stage, according to some embodiments.
Figure 12D:
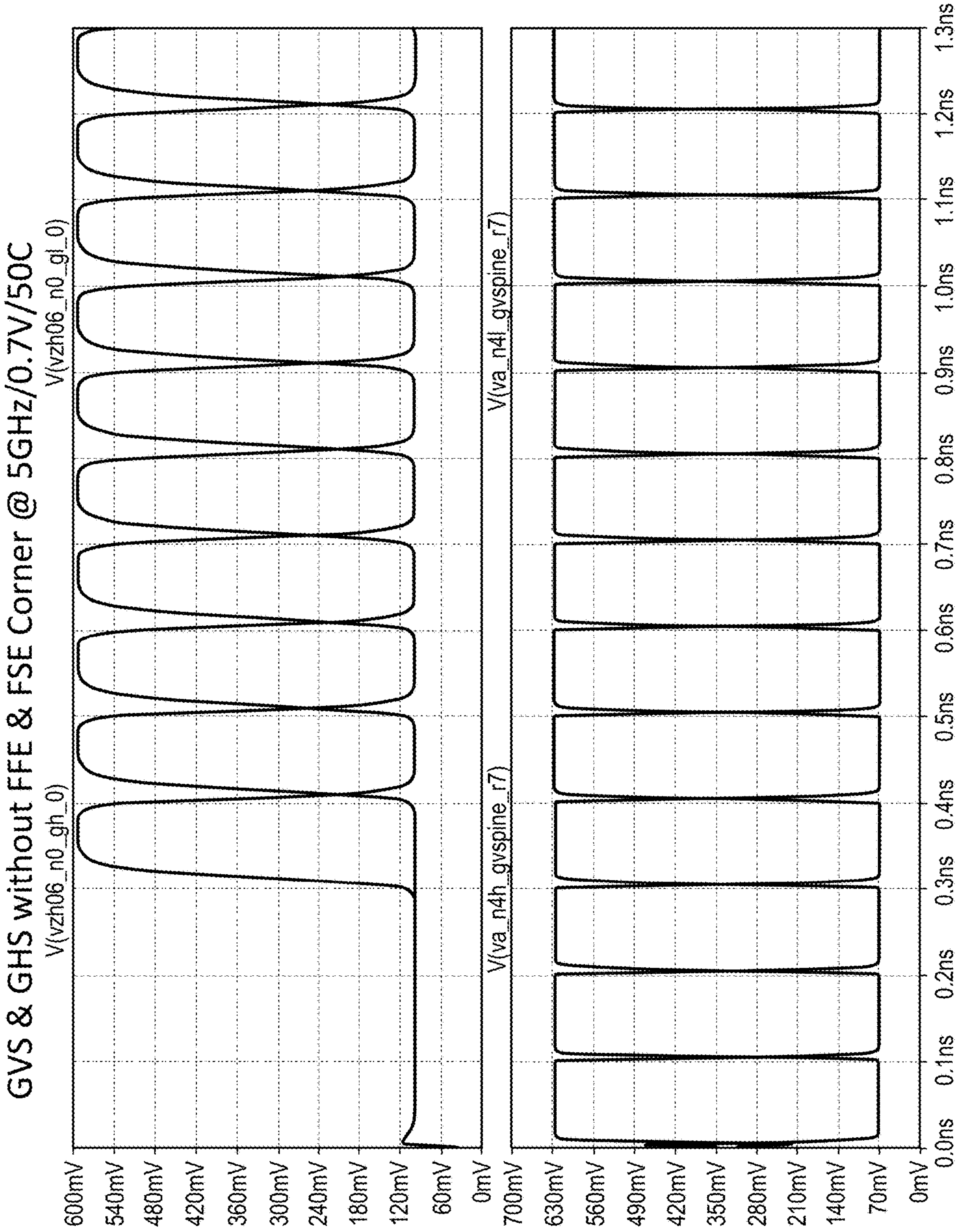
FIG. 12D shows a plot of global clock distribution network stage output without nonlinear feed forward equalization at 5 GHz/0.7V/50 C with input clock and output clock waveforms, according to some embodiments.
Figure 12E:
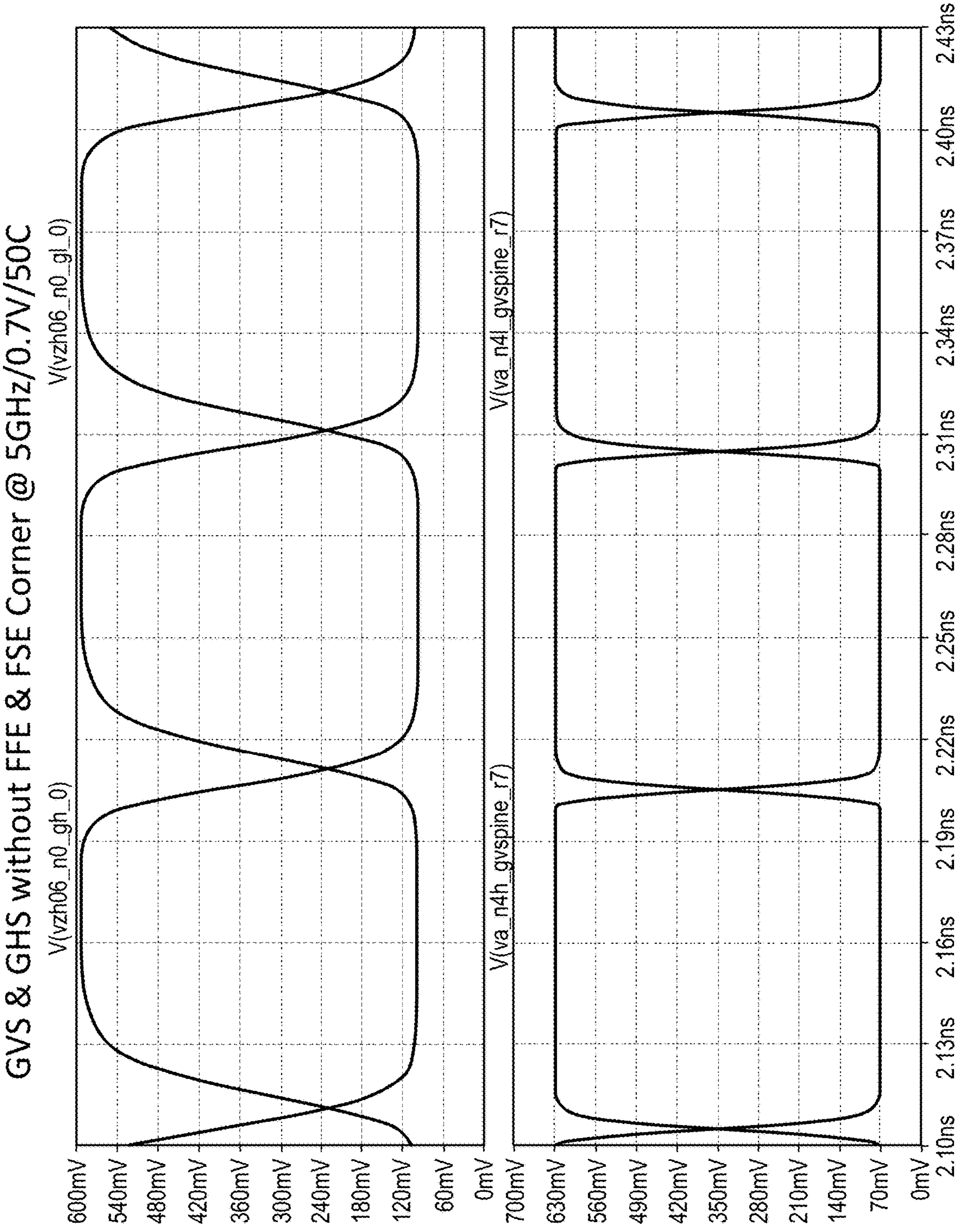
FIG. 12E shows a plot of global clock distribution network stage output without nonlinear feed forward equalization at 5 GHz/0.7V/50 C with zoomed in input clock and output clock waveforms, according to some embodiments.

FIG. 10A illustrates an example combination of a single global vertical spine and 8 global horizontal spines to clock a multiprocessor array of 128 processor cores. In this example the processor cores provide the clocks (not shown) to the I/O channels. In this example the global vertical spine is located in an end-fire location to the LHS of the layout floorplan. FIGS. 10B and 10C illustrate alternate combinations of global vertical and global horizontal spine topologies. FIG. 10B illustrates an example combination of a single global vertical spine and 8 global horizontal spines, where the global vertical spine is located in the center of the layout floorplan. FIG. 10C illustrates an example combination of a two global vertical spines and 8 global horizontal spines where the dual global vertical spines are located on either end (LHS and RHS) of the layout floorplan.

FIGS. 11A-E illustrate the performance of FIG. 8A's global horizontal distribution network for the entire clock network using the dual-rail nonlinear feed forward equalization method and apparatus. The plots illustrated in FIGS. 11A-E show data for both the global vertical spine (GVS) and global horizontal spine (GHS) with feed-forward equalization (FFE) and an FSE corner for parameter values of 5 GHz, 0.7 Volts, and 50 degrees Celsius. The duty cycle at the output of the global vertical and horizontal distribution network is 49.5%. The total delay from the PLL output to the output of the global vertical and horizontal clock network is 278 ps. The rise time is approximately 17 ps and fall time is approximately 14 ps at the output of the network.

FIGS. 12A-E illustrate the performance of FIG. 8A's global horizontal distribution network for the entire clock network without using the dual-rail nonlinear feed forward equalization method and apparatus. The plots illustrated in FIGS. 11A-E show data for both the GVS and GHS without FFE and an FSE corner for parameter values of 5 GHz, 0.7 Volts, and 50 degrees Celsius. The duty cycle at the output of the global vertical and horizontal clock network is 44.98%. The total delay from the PLL output to the output of the vertical and horizontal clock distribution network is 313 ps. The rise time is approximately 17 ps and fall time is approximately 14 ps at the output of the network.

In various embodiments, the described dual-rail buffer circuit may be used in the following applications, among other possibilities:

1. Transmitter driver in a SerDes or clock forwarding type high speed interface
2. Delay element in a time-to-digital convertor
3. With added header and footer devices as a ring oscillator stage in a voltage-controlled oscillator (VCO) in a phase-locked loop.
4. With added header and footer devices as a delay stage in a delay locked loop As used herein, a 'SerDes' is an interface circuit between connections carrying data in parallel and a few (perhaps one) connections carrying serial data. The serial data connections may run at higher speed and with faster edge rates than the parallel connections by their parallel/serial ratio. It is often the case that the serial data is sent off-chip, so the transmitter circuit will be sending signals into transmission lines with various impedance bumps and resulting reflections.

'Clock forwarding' refers to sending a clock signal from one chip to another in order to pass data between them synchronously.

Header and footer devices are large metal-oxide-semiconductor field-effect transistors (MOSFETs) placed between the power inputs to the buffer circuit and the power rails of the IC chip. The header and footer devices limit the supply current allowed through the buffer circuit. The current limiting of these devices suppresses power supply noise from entering the buffer, and the current limit level may be adjusted to control the mid-signal gain of the buffer, which affects the buffer's propagation delay. If the MOSFET gate terminals of the header and footer devices are connected to controlled voltage sources, it may enable high-precision voltage tuning of the buffer propagation delay, which is very useful to delay/phase-locked loop design.

What is claimed is:

1. A dual-rail buffer circuit, comprising:

a first input port configured to receive a first input signal;

a second input port configured to receive a second input signal;

a first output port coupled via a first channel to the first input and configured to output a first output signal;

a second output port coupled via a second channel to the second input and configured to output a second output signal;

a zeroth inverter and a second inverter comprised within the first channel between the first input and the first output;

a first inverter and a third inverter comprised within the second channel between the second input and the second output;

a fourth inverter and a fifth inverter coupled to the first channel and the second channel, wherein the fourth and fifth inverters are coupled to the first channel in between the zeroth and second inverters, wherein the fourth and fifth inverters are coupled to the second channel in between the first and third inverters, and wherein the fourth and fifth inverters are coupled to the first and second channels with opposite polarity;

a sixth inverter, wherein the sixth inverter is connected to the first channel after the zeroth and second inverters, and wherein the sixth inverter is connected to the second channel before the first and third inverters;

a seventh inverter, wherein the seventh inverter is connected to the first channel before the zeroth and second inverters, and wherein the seventh inverter is connected to the second channel after the first and third inverters; and a third input port configured to receive an enable input signal, wherein the fourth, fifth, sixth and seventh inverters comprise tri-inverters, wherein the third input port is connected to the fourth, fifth, sixth and seventh inverters, and wherein a value of the enable input current is controllable to enable and disable an effect of the fourth, fifth, sixth and seventh inverters on the dual-rail buffer circuit.

2. The dual-rail buffer circuit of claim 1, wherein the fourth and fifth inverters have a first strength that is less than respective strengths of the zeroth, first, second, third, sixth and seventh inverters.

3. The dual-rail buffer circuit of claim 1, wherein the second and third inverters comprise tri-inverters, wherein the third input port is further connected to the second and third inverters, wherein the dual-rail buffer circuit further comprises a fourth input port configured to receive a second enable input signal, wherein the fourth input port is connected to the second, third, fourth, fifth, sixth and seventh inverters, and wherein a value of the second enable input current is controllable in coordination with the value of the enable input current to enable and disable an effect of the second and third inverters on the dual-rail buffer circuit.

4. The dual-rail buffer circuit of claim 1, wherein the zeroth inverter has a first strength that is half as large as a second strength of the second inverter, and wherein the first inverter has a third strength that is half as large as a fourth strength of the third inverter.

5. The dual-rail buffer circuit of claim 1, wherein the zeroth inverter has a first strength that is twice as large as a second strength of the seventh inverter, and wherein the first inverter has a third strength that is twice as large as a fourth strength of the sixth inverter.

6. The dual-rail buffer circuit of claim 1, wherein the dual-rail buffer circuit is configured within a global clock distribution network.

7. The dual-rail buffer circuit of claim 6, wherein the dual-rail buffer circuit is configured within the global clock distribution network as a modular unit comprising the dual-rail buffer circuit and a transmission line.

8. The dual-rail buffer circuit of claim 1, wherein the sixth and seventh inverters provide fractional nonlinear feed-forward equalization to the first and second outputs.

9. The dual-rail buffer circuit of claim 1, wherein the zeroth and first inverters each comprise two respective standardized inverter units connected in parallel, and wherein the second and third inverters each comprise four respective standardized inverter units connected in parallel.

10. The dual-rail buffer circuit of claim 9, wherein the sixth and seventh inverters each comprise one standardized inverter unit.

11. A global clock distribution network, comprising:

a plurality of standardized units, wherein each standardized unit comprises a dual-rail buffer circuit coupled to a transmission line, wherein the dual-rail buffer circuit comprises:

a first input port configured to receive a first input signal;

a second input port configured to receive a second input signal;

a first output port coupled via a first channel to the first input and configured to output a first output signal;

a second output port coupled via a second channel to the second input and configured to output a second output signal;

a zeroth inverter and a second inverter comprised within the first channel between the first input and the first output;

a first inverter and a third inverter comprised within the second channel between the second input and the second output;

a fourth inverter and a fifth inverter coupled to the first channel and the second channel, wherein the fourth and fifth inverters are coupled to the first channel in between the zeroth and second inverters, wherein the fourth and fifth inverters are coupled to the second channel in between the first and third inverters, and wherein the fourth and fifth inverters are coupled to the first and second channels with opposite polarity;

a sixth inverter, wherein the sixth inverter is connected to the first channel after the zeroth and second inverters, and wherein the sixth inverter is connected to the second channel before the first and third inverters;

a seventh inverter, wherein the seventh inverter is connected to the first channel before the zeroth and second inverters, and wherein the seventh inverter is connected to the second channel after the first and third inverters; and a third input port configured to receive an enable input signal, wherein the fourth, fifth, sixth and seventh inverters comprise tri-inverters, wherein the third input port is connected to the fourth, fifth, sixth and seventh inverters, and wherein a value of the enable input current is controllable to enable and disable an effect of the fourth, fifth, sixth and seventh inverters on the dual-rail buffer circuit.

12. The global clock distribution network of claim 11, wherein the fourth and fifth inverters have a first strength that is less than respective strengths of the zeroth, first, second, third, sixth and seventh inverters.

13. The global clock distribution network of claim 11, wherein the zeroth inverter has a first strength that is half as large as a second strength of the second inverter, and wherein the first inverter has a third strength that is half as large as a fourth strength of the third inverter.

14. The global clock distribution network of claim 11, wherein the zeroth inverter has a first strength that is twice as large as a second strength of the seventh inverter, and wherein the first inverter has a third strength that is twice as large as a fourth strength of the sixth inverter.

15. The global clock distribution network of claim 11, wherein the sixth and seventh inverters provide fractional nonlinear feed-forward equalization to the first and second outputs.

16. The global clock distribution network of claim 11, wherein the zeroth and first inverters each comprise two respective standardized inverter units connected in parallel, and wherein the second and third inverters each comprise four respective standardized inverter units connected in parallel.

17. The global clock distribution network of claim 11, further comprising:

a plurality of T connections, wherein the plurality of standardized units and the plurality of T connections are configured in a tree structure comprising a plurality of stages, wherein the modular global clock distribution network is configured to provide synchronized timing information to each of a plurality of circuit modules, and wherein a length of the standardized units is determined based at least in part on a pitch length of the circuit modules.

18. The global clock distribution network of claim 11, wherein the second and third inverters comprise tri-inverters, wherein the third input port is further connected to the second and third inverters, wherein the dual-rail buffer circuit further comprises a fourth input port configured to receive a second enable input signal, wherein the fourth input port is connected to the second, third, fourth, fifth, sixth and seventh inverters, and wherein a value of the second enable input current is controllable in coordination with the value of the enable input current to enable and disable an effect of the second and third inverters on the dual-rail buffer circuit.

19. The global clock distribution network of claim 11, wherein the plurality of standardized units comprises a plurality of modular units.

20. The global clock distribution network of claim 16, wherein the sixth and seventh inverters each comprise one standardized inverter unit.

* * * * *